(12) United States Patent
Kasano et al.

(10) Patent No.: US 8,227,883 B2
(45) Date of Patent: Jul. 24, 2012

(54) SOLID-STATE IMAGING DEVICE AND CAMERA

(75) Inventors: Masahiro Kasano, Osaka (JP); Shinzo Koyama, Osaka (JP)

(73) Assignee: Panasonic Corporation, Osaka (JP)

( * ) Notice: Subject to any disclaimer, the term of this patent is extended or adjusted under 35 U.S.C. 154(b) by 479 days.

(21) Appl. No.: 12/491,472

(22) Filed: Jun. 25, 2009

(65) Prior Publication Data
US 2009/0321865 A1 Dec. 31, 2009

(30) Foreign Application Priority Data

Jun. 30, 2008 (JP) ................................ 2008-171714

(51) Int. Cl.
*H01L 31/0232* (2006.01)
(52) U.S. Cl. ................................. 257/432; 257/E31.127
(58) Field of Classification Search .............. 257/81, 257/98–99, 100, 292, 432, 440, 433–435, 257/E31.127; 250/208.1, 214 R, 214.1; 348/246, 348/294, 272, 296, 277
See application file for complete search history.

(56) References Cited

U.S. PATENT DOCUMENTS

| | | | |
|---|---|---|---|
| 5,929,432 A | 7/1999 | Yamakawa | |
| 7,663,668 B2 | 2/2010 | Kuno et al. | |
| 7,928,352 B2 * | 4/2011 | Toda | 250/208.1 |
| 8,018,509 B2 | 9/2011 | Numata | |
| 8,134,191 B2 | 3/2012 | Yamaguchi et al. | |
| 2006/0186322 A1 | 8/2006 | Matsuyama | |
| 2006/0205107 A1 | 9/2006 | Inaba et al. | |
| 2007/0058055 A1 | 3/2007 | Yamaguchi et al. | |
| 2007/0187794 A1 | 8/2007 | Fukuyoshi et al. | |
| 2007/0272836 A1 | 11/2007 | Higashitsutsumi et al. | |
| 2008/0251873 A1 | 10/2008 | Kasano et al. | |
| 2008/0277702 A1 | 11/2008 | Katsuno et al. | |
| 2008/0278592 A1 | 11/2008 | Kuno et al. | |
| 2008/0291303 A1 | 11/2008 | Onozawa et al. | |
| 2008/0304156 A1 | 12/2008 | Koyama | |
| 2009/0009621 A1 | 1/2009 | Yamaguchi et al. | |
| 2009/0014824 A1 | 1/2009 | Sakoh et al. | |
| 2009/0066793 A1 | 3/2009 | Takeda | |

(Continued)

FOREIGN PATENT DOCUMENTS

JP 2004-032243 1/2004
(Continued)

OTHER PUBLICATIONS

English language Abstract of JP 2006-237737, Sep. 7, 2006.
(Continued)

*Primary Examiner* — Hoa B Trinh
(74) *Attorney, Agent, or Firm* — Greenblum & Bernstein, P.L.C.

(57) ABSTRACT

A solid-state imaging device having a color filter with high color reproducibility even in the case of using lighting of low color temperatures. The solid-state imaging device has a plurality of pixels arranged two-dimensionally, and comprises a color separation filter which allows transmission of light of a predetermined wavelength in incident light for each of the plurality of pixels, wherein the color separation filter includes: a visible-light and near-infrared filter having transmission bands in regions of a visible wavelength band and a near-infrared wavelength band; and a near-infrared normalization filter laminated with the visible-light and near-infrared filter, wherein the near-infrared normalization filter is substantially transparent in the visible wavelength band and a first near-infrared wavelength band, and is substantially not transparent in a second near-infrared wavelength band between the visible wavelength band and the first near-infrared wavelength band.

16 Claims, 15 Drawing Sheets

U.S. PATENT DOCUMENTS

2010/0283866 A1   11/2010   Numata

FOREIGN PATENT DOCUMENTS

| | | |
|---|---|---|
| JP | 2006-094112 | 4/2006 |
| JP | 2006-237737 | 9/2006 |
| JP | 2007-311447 | 11/2007 |
| JP | 2008-067058 | 3/2008 |
| JP | 2008-289001 | 11/2008 |
| JP | 2008-306070 | 12/2008 |
| WO | 2005/069376 | 7/2005 |
| WO | 2007/086155 | 8/2007 |

OTHER PUBLICATIONS

English language Abstract of JP 2008-306070, Dec. 18, 2008.
Japan Office action, mail date is Mar. 21, 2012.

* cited by examiner

SOLID-STATE IMAGING DEVICE AND CAMERA

BACKGROUND OF THE INVENTION (1) Field of the Invention

The present invention relates to a solid-state imaging device and a camera, and in particular to a technique of color separation by using a color filter of a solid-state imaging device that detects visible light and near-infrared light.

(2) Description of the Related Art

In recent years, the range of application for solid-state imaging devices such as digital cameras and mobile phones has been expanding rapidly, and colorization has become essential in any field.

FIGS. 8A and 8B are diagrams related to a solid-state imaging device according a conventional art. FIG. 8A illustrates an array of pixels of the solid-state imaging device according the conventional art. FIG. 8B illustrates the spectral characteristics of the pixels of the solid-state imaging device according the conventional art.

As shown in FIGS. 8A and 8B, an infrared cut filter is removed, and an infrared light filter (IR filter) that allows transmission of only the IR components of incident light is deposited on pixels in addition to color filters that allow transmission of RGB light components. A solid-state imaging device with such a structure having infrared-light-receiving pixels that detect only the IR components has been devised (Patent Reference 1: Japanese Unexamined Patent Application Publication No. 2006-237737, for example).

In the solid-state imaging device of Patent Reference 1: Japanese Unexamined Patent Application Publication No. 2006-237737, a signal generated by the infrared-light-receiving pixels (hereinafter referred to as IR pixels) serves as a reference signal that provides each light-receiving pixel with information regarding an amount of signals generated due to the IR components. That is, using reference signals from the IR pixels allows color signal processing to eliminate effects of the IR components included in each color signal generated by each RGB light-receiving pixel.

Here, a color filter of each IR pixel is formed by laminating an R filter and a B filter.

It is to be noted that the above structure shown in FIGS. 8A and 8B is a structure of a solid-state imaging device using an organic material, such as pigments and dyes, as a color filter (hereinafter referred to as an organic filter). A structure of a solid-state imaging device using a dielectric multilayer film as a color filter has also been devised (for example, Patent Reference 2: see pamphlet of International Application Publication No. 05/069376).

FIGS. 9A and 9B are diagrams related to a solid-state imaging device according a conventional art. FIG. 9A illustrates a cross-sectional structure of a color filter of a solid-state imaging device according to Patent Reference 2 in the case of using a dielectric multilayer film as a color filter. FIG. 9B illustrates the transmission characteristics of the color filter of the solid-state imaging device disclosed Patent Reference 2: see pamphlet of International Application Publication No. 05/069376.

The color filter using a dielectric multilayer film according to the solid-state imaging device disclosed in Patent Reference 2: see pamphlet of International Application Publication No. 05/069376, separates colors of R, G, B, and IR as with the above mentioned organic filter. Although Patent Reference 2 does not mention the spectral characteristics of the IR filter, it can be achieved by changing the thickness of a spacer layer.

SUMMARY OF THE INVENTION

However, when subtracting the reference signal of IR pixels from the signal output of RGB pixels, the IR signals contained in the signal output obtained from the RGB pixels cannot be fully subtracted due to variation in spectral characteristics of the respective pixels, that is, the RGB pixels, in the region of 700 nm to 850 nm as shown in FIGS. 8B and 9B. That is to say, the IR signals cannot be fully subtracted from the RGB pixels, or signals other than the IR signals are subtracted from the RGB pixels in addition to the IR signals. This results in a color shift, which is a shift from a luminescent color which should inherently be perceived from the RGB pixels. In particular, a color shift occurs with lighting of low color temperatures.

The present invention has been conceived in view of the above described problems, and an object of the present invention is to provide a solid-state imaging device having a color filter with high color reproducibility even in the case of using lighting of low color temperatures.

In order to achieve the object, the solid-state imaging device according to the present invention is a solid-state imaging device having a plurality of pixels arranged two-dimensionally, the solid-state imaging device comprising a color separation filter which allows transmission of light of a predetermined wavelength in incident light for each of the plurality of pixels, wherein the color separation filter includes: a visible-light and near-infrared filter having transmission bands in regions of a visible wavelength band and a near-infrared wavelength band; and a near-infrared normalization filter laminated with the visible-light and near-infrared filter, wherein the near-infrared normalization filter is substantially transparent in the visible wavelength band and a first near-infrared wavelength band, and is substantially not transparent in a second near-infrared wavelength band between the visible wavelength band and the first near-infrared wavelength band.

With this, due to the spectral characteristics obtained through the structure in which the two filters are laminated, namely, the visible-light and near-infrared filter and the near-infrared normalization filter, the spectral characteristics of the color separation filter with respect to light having wavelengths equal to or above 700 nm can be made approximately equal over the R, G, B, and IR pixels. Thus, high color reproducibility can be achieved without causing a color shift even when using lighting of low color temperatures.

A bandwidth of the first near-infrared wavelength band may be equal to or less than 100 nm.

This structure allows the first near-infrared regions of a plurality of color separation filters to have approximately equal transmission bands.

Further, a band-center wavelength of the first near-infrared wavelength band may be equal to or more than 700 nm.

This structure makes it possible to provide a color separation filter that allows selective transmission of light in the near-infrared region.

Furthermore, an edge of the second near-infrared wavelength band on a shorter wavelength side may be at a wavelength of between 600 and 700 nm inclusive.

This structure makes it possible to provide a solid-state imaging device with high color reproducibility even without an infrared cut filter.

Furthermore, it may be that the visible-light and near-infrared filter is a multilayer interference filter, and when a set wavelength which is set in relation to the light of the predetermined wavelength is $\lambda_1$, the multilayer interference filter includes: a first layer made of a high refractive index material having an optical thickness of $\lambda_1/4$; a second layer made of a low refractive index material having an optical thickness of $\lambda_1/4$ which is equal to the optical thickness of the first layer; two $\lambda_1/4$ multilayer films each of which includes the first layer and the second layer; and a first spacer layer which is formed between the two $\lambda_1/4$ multilayer films and controls transmission of the light of the predetermined wavelength for each of the plurality of pixels.

This structure makes it possible to perform color separation using the multilayer interference filter, and thus high color reproducibility can be achieved.

Moreover, it may be that the solid-state imaging device comprises at least a first pixel and a second pixel as the plurality of pixels, and the first spacer layer corresponding to the first pixel has an optical thickness different from an optical thickness of the first spacer layer corresponding to the second pixel.

This structure makes it possible to perform color separation simply by changing the thickness of the spacer layer, and thus the process of forming the multilayer film becomes easier.

In addition, it may be that the solid-state imaging device comprises a first pixel, a second pixel, a third pixel, and a fourth pixel as the plurality of pixels, each of the first layer and the second layer has an optical thickness of $\lambda_1/4$, the first spacer layer has four different optical thicknesses on the first pixel, the second pixel, the third pixel, and the fourth pixel, the first spacer layer of the first pixel has an optical thickness of 0, the first spacer layer of the second pixel has an optical thickness of between 0 and $\lambda_1/4$ inclusive, the first spacer layer of the third pixel has an optical thickness approximately equal to $\lambda_1/4$, and the first spacer layer of the fourth pixel has an optical thickness of between $\lambda_1/4$ and $\lambda_1/2$ inclusive.

This structure makes it possible to perform color separation simply by changing the thickness of the spacer layer, and thus the process of forming the multilayer film becomes easier.

Furthermore, it may be that the visible-light and near-infrared filter is a multilayer interference filter, and when a set wavelength which is set in relation to the light of the predetermined wavelength is $\lambda_1$, the multilayer interference filter includes: a first layer made of a high refractive index material having an optical thickness of $\lambda_1/4$; a second layer made of a low refractive index material having an optical thickness of $\lambda_1/4$ which is equal to the optical thickness of the first layer; and a first spacer layer which controls transmission of the light of the predetermined wavelength for each of the plurality of pixels, and the multilayer interference filter includes a plurality of three-layered films, and the second layer is formed between the plurality of three-layered films, each of the three-layered films including the first layer, the first spacer layer, and the first layer which are laminated in order of mention.

This structure makes it possible to perform color separation using the multilayer interference filter, and thus high color reproducibility can be achieved.

Moreover, it may be that the solid-state imaging device comprises at least a first pixel and a second pixel as the plurality of pixels, and the first spacer layers corresponding to the first pixel have an optical thickness different from an optical thickness of the first spacer layers corresponding to the second pixel.

This structure makes it possible to perform color separation simply by changing the thicknesses of the plurality of spacer layers. Additionally, by using the plurality of spacer layers, a color filter with excellent color separation characteristics can be provided.

Moreover, it may be that the solid-state imaging device comprises a first pixel, a second pixel, a third pixel, and a fourth pixel as the plurality of pixels, and each of the first layer and the second layer has an optical thickness of $\lambda_1/4$, the first spacer layers have four different optical thicknesses on the first pixel, the second pixel, the third pixel, and the fourth pixel, the first spacer layers of the first pixel have an optical thickness of between 0 and $\lambda_1/4$ inclusive, the first spacer layers of the second pixel have an optical thickness approximately equal to $\lambda_1/4$, the first spacer layers of the third pixel have an optical thickness of between $\lambda_1/4$ and $\lambda_1/2$ inclusive, and the first spacer layers of the fourth pixel have an optical thickness approximately equal to $\lambda_1/2$.

This makes it possible to provide a color filter with excellent color separation characteristics in a wide band.

Further, when a set wavelength which is set in relation to the light of the predetermined wavelength is $\lambda_2$, the near-infrared normalization filter may include: a third layer made of a high refractive index material having an optical thickness of $\lambda_2/4$; a fourth layer made of a low refractive index material having an optical thickness of $\lambda_2/4$ which is equal to the optical thickness of the third layer; two $\lambda_2/4$ multilayer films each of which includes the third layer and the fourth layer; and a second spacer layer which is formed between the two $\lambda_2/4$ multilayer films and controls transmission of the light of the predetermined wavelength for each of the plurality of pixels.

This structure allows selective transmission of visible light in a wide wavelength region of the visible-light region and near-infrared light.

Further, when a set wavelength which is set in relation to the light of the predetermined wavelength is $\lambda_2$, the near-infrared normalization filter may include: a third layer made of a high refractive index material having an optical thickness of $\lambda_2/4$; a fourth layer made of a low refractive index material having an optical thickness of $\lambda_2/4$ which is equal to the optical thickness of the third layer; two $\lambda_2/4$ multilayer films each of which includes the third layer and the fourth layer; and a second spacer layer which is formed between the two $\lambda_2/4$ multilayer films and controls transmission of the light of the predetermined wavelength for each of the plurality of pixels, wherein the second spacer layer has an optical thickness of $\lambda_2/2$.

With this structure, the process of planarizing the device, performed after forming the color separation filter, can be made easier.

Furthermore, it may be that the set wavelength $\lambda_1$ is a wavelength of between 400 nm and 700 nm inclusive, and the set wavelength $\lambda_2$ is a wavelength of between 700 nm and 1100 nm inclusive.

This makes it possible to provide an excellent color separation filter for use in a solid-state imaging device that captures images using visible light and near-infrared light.

Moreover, the visible-light and near-infrared filter and the near-infrared normalization filter may be made of an identical material.

This reduces the cost of manufacturing the multilayer interference filter.

FURTHER INFORMATION ABOUT TECHNICAL BACKGROUND TO THIS APPLICATION

The disclosure of Japanese Patent Application No. 2008-171714 filed on Jun. 30, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Hereinafter, embodiments of a solid-state imaging device and a camera according to the present invention shall be described with reference to the drawings by taking a digital still camera as an example. It should be noted that although the present invention shall be described using the embodiments below as well as the drawings attached, this description is provided as an example and the present invention is not limited to this.

(Embodiment 1)

First, the structure of a digital still camera according to the embodiments of the present invention shall be described.

Figure 1:
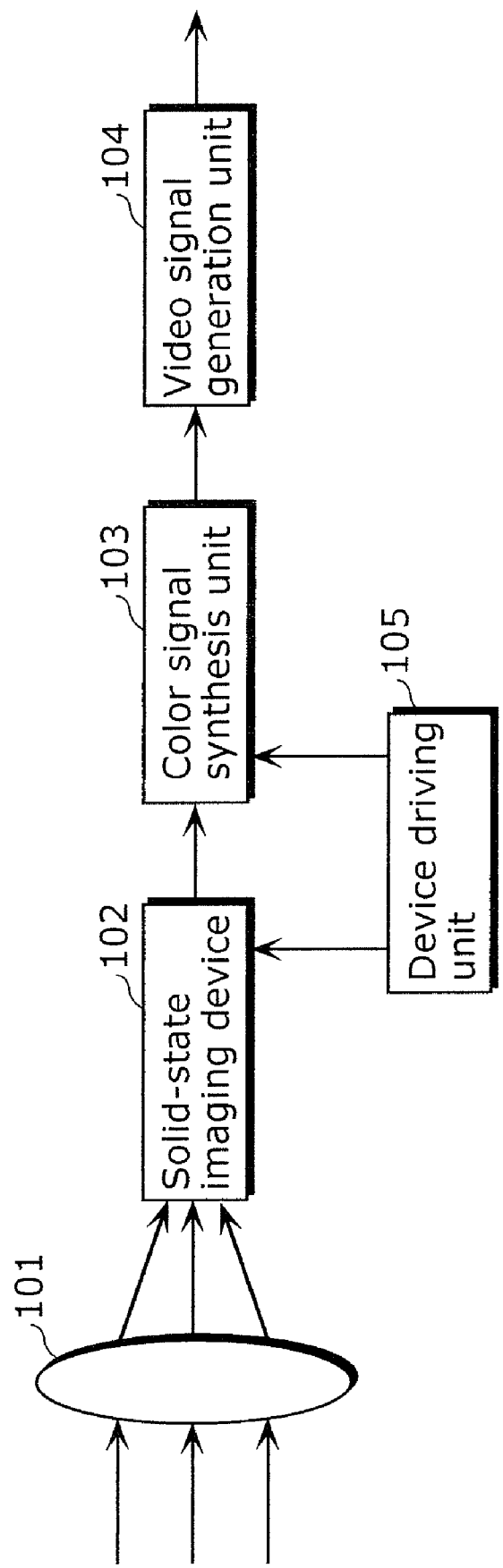
FIG. 1 is a block diagram illustrating a fundamental functional structure of a digital still camera 1 according to Embodiment 1 of the present invention.

FIG. 1 is a block diagram illustrating a fundamental functional structure of a digital still camera according to Embodiment 1.

As shown in FIG. 1, a digital still camera 1 according to the present embodiment includes a lens 101, a solid-state imaging device 102, a color signal synthesis unit 103, a video signal generation unit 104, and a device driving unit 105.

From light incident on the digital still camera 1, the lens 101 forms an image on an imaging area of the solid state imaging device 102.

The solid-state imaging device 102 is a MOS image sensor or the like which generates color signals by photoelectrically converting the incident light.

The device driving unit 105 is a circuit which read out the color signals from the solid-state imaging device 102.

The color signal synthesis unit 103 is a DSP or the like which performs color shading on the color signals obtained from the solid-state imaging device 102.

The video signal generation unit 104 is a DSP or the like which generates color video signals from the color signals on which the color shading has been performed by the color signal synthesis unit 103.

It is to be noted that the color video signals are eventually recorded on a recording medium as color image data.

Next, the structure of the solid-state imaging device 102 shall be described.

Figure 2:
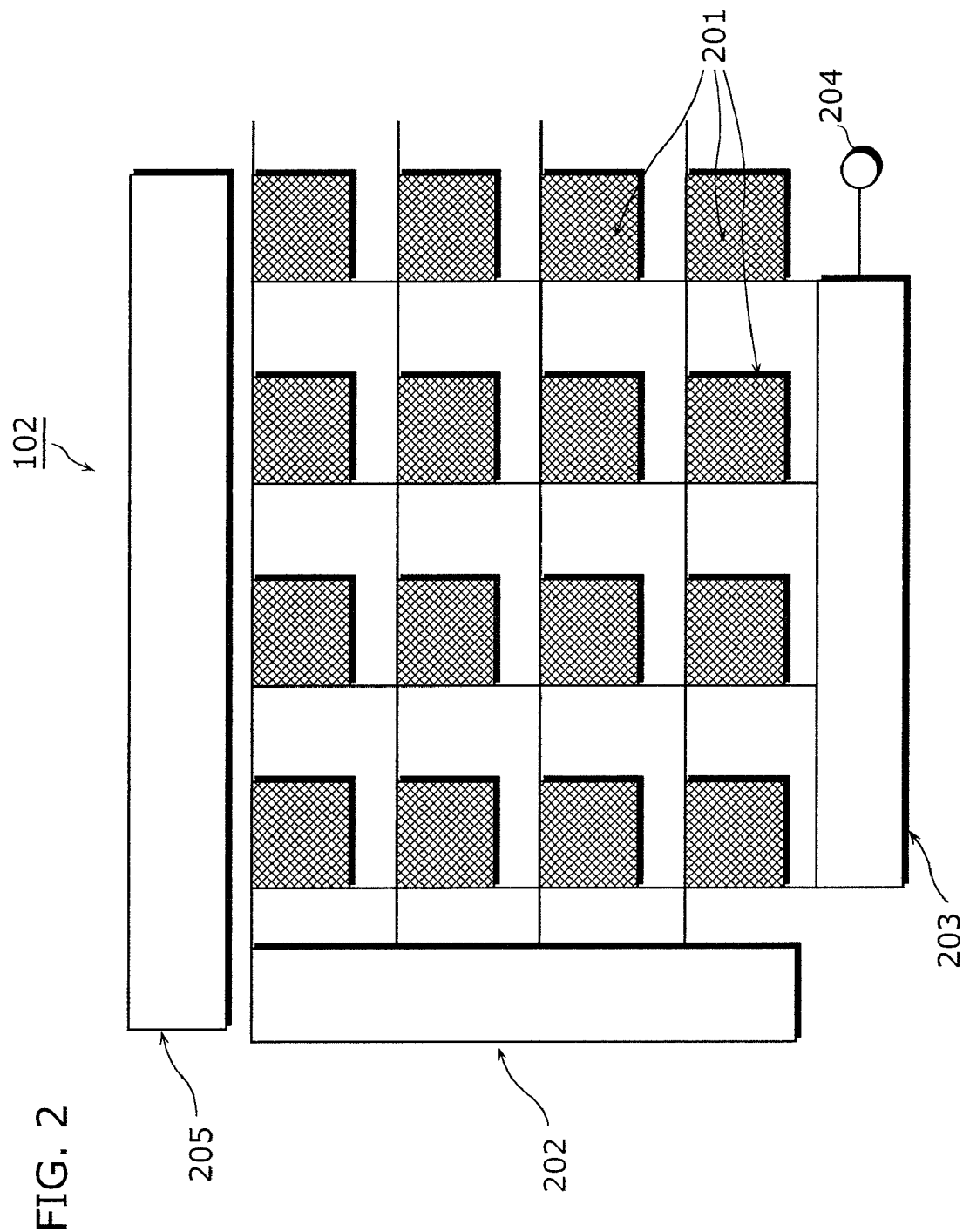
FIG. 2 illustrates a conceptual structure of a solid-state imaging device 102 included in a digital still camera 1 according to Embodiment 1 of the present invention.

FIG. 2 illustrates a conceptual structure of the solid-state imaging device 102 according to Embodiment 1.

As shown in FIG. 2, in the solid-state imaging device 102, each row of unit pixels 201 arranged two-dimensionally is selected by a vertical shift register 202, the row signal is selected by a horizontal shift register 203, and a color signal of each unit pixel 201 is outputted from an output amplifier 204. That is, in the solid-state imaging device 102, a driving circuit 205 drives the vertical shift register 202, the horizontal shift register 203, and the output amplifier 204.

As shown in FIG. 2, a plurality of unit pixels 201 are formed, and each of them is a pixel that generates a signal of one of R (red), G (green), B (blue), and IR (infrared).

Figure 3:
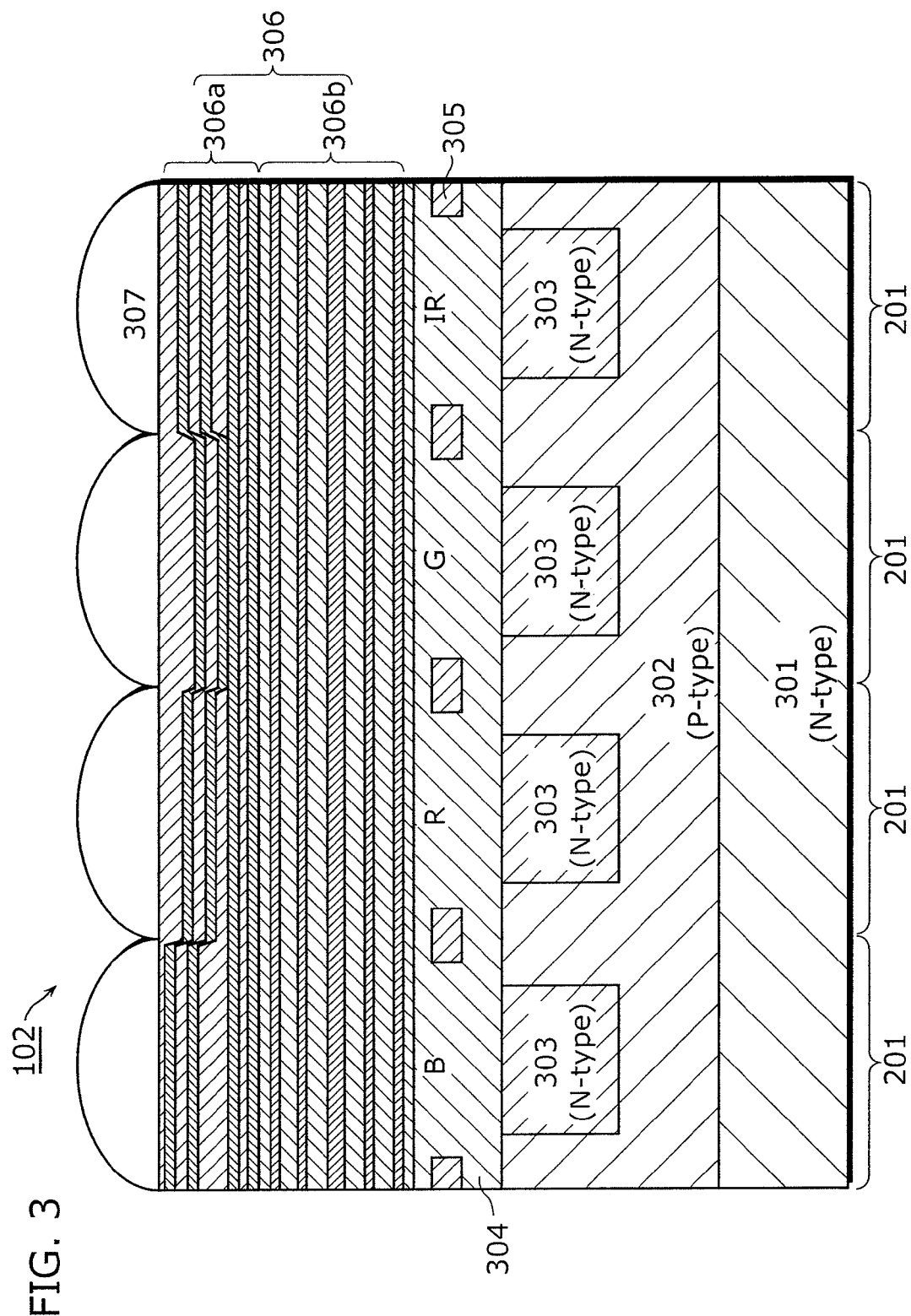
FIG. 3 is a cross-section diagram of unit pixels 201 of a solid-state imaging device 102 according to Embodiment 1 of the present invention.

FIG. 3 is a cross-section diagram of the unit pixels 201 of the solid-state imaging device 102 according to Embodiment 1.

As shown in FIG. 3, in the solid-state imaging device 102, a P-type semiconductor layer 302, an inter-layer insulation film 304, a color separation filter 306, and collecting lenses 307 are sequentially laminated on an N-type semiconductor layer 301. Further, a photodiode 303 created by implanting N-type impurities is formed for each unit pixel 201 on the inter-layer insulation film 304 side of the P-type semiconductor layer 302. Interposed between adjacent photodiodes 303 is a P-type semiconductor layer (referred to as an element separation region). Furthermore, light shielding films 305 are formed in the inter-layer insulation film 304. Each photodiode 303 is in a corresponding relationship with one of the collecting lenses 307, and each light shielding film 305 prevents light which has passed through the collecting lenses 307 from entering a photodiode 303 that is not in a corresponding relationship.

The color separation filter 306 has a structure in which a visible-light and near-infrared filter 306a and a near-infrared normalization filter 306b are laminated. The visible-light and near-infrared filter 306a allows color separation of light incident on the solid-state imaging device 102 into light of R, G, B, and IR, and the near-infrared normalization filter 306b allows transmission of visible light and near-infrared light. By having such a color separation filter 306, the solid-state imaging device 102 suppresses variation in spectral characteristics of the RGB pixels with respect to light having wavelengths of 700 nm to 850 nm. The details thereof shall be described later.

FIGS. 4A to 4E illustrate the structure and spectral characteristics of the color separation filter 306 of the solid-state imaging device 102 according to Embodiment 1.

Figure 4A:
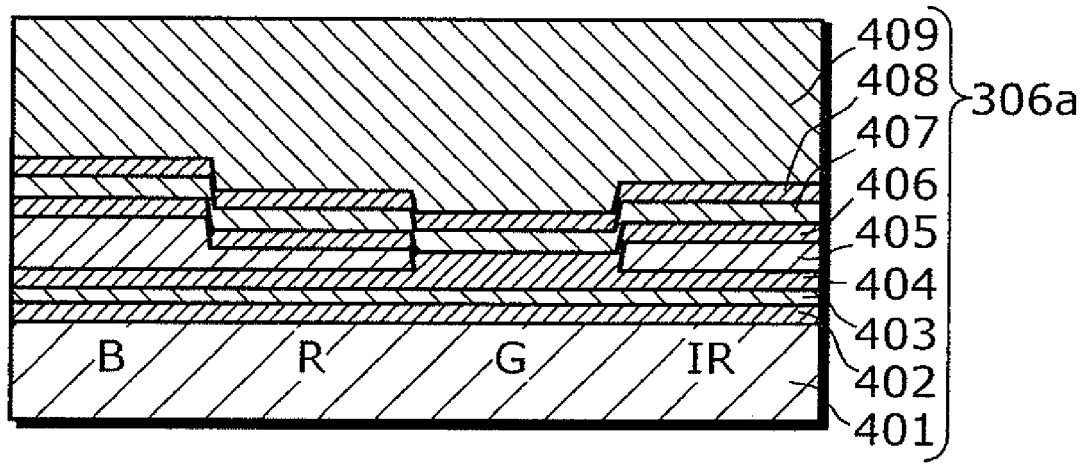
FIG. 4A illustrates a conceptual structure of a visible-light and near-infrared filter 306a, which allows color separation of visible light, of a color separation filter 306 according to Embodiment 1 of the present invention.
Figure 4B:
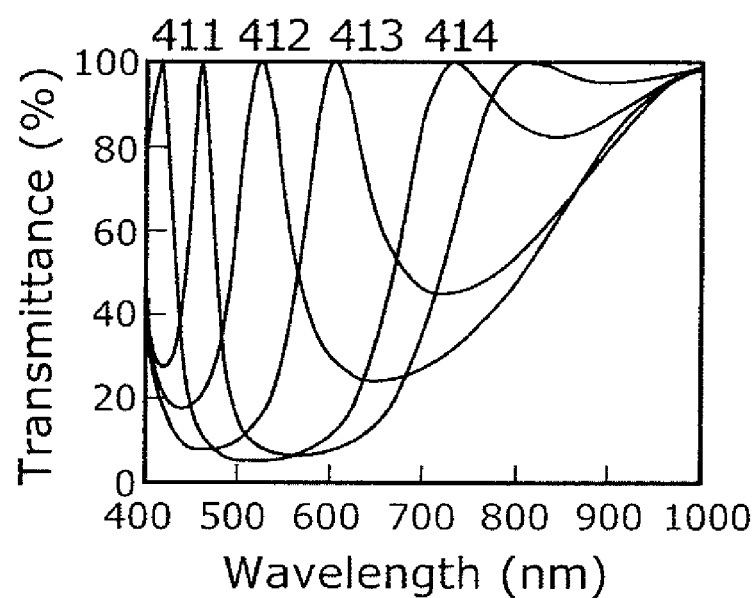
FIG. 4B illustrates the spectral characteristics of a visible-light and near-infrared filter 306a according to Embodiment 1 of the present invention.
Figure 4C:
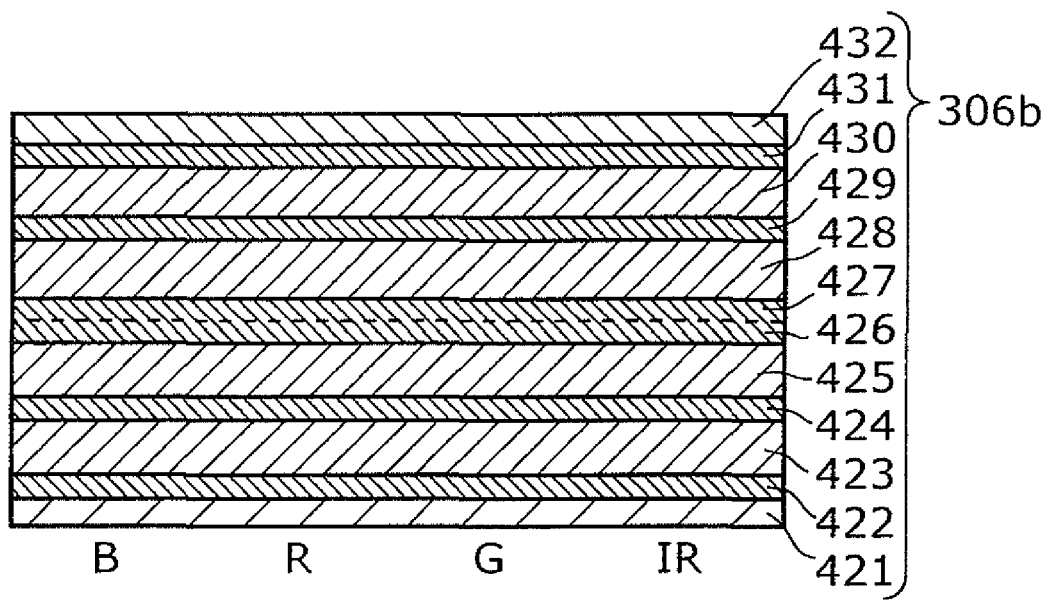
FIG. 4C illustrates a conceptual structure of a near-infrared normalization filter 306b which allows selective transmission of visible light and near-infrared light passing through a visible-light and near-infrared filter 306a according to Embodiment 1 of the present invention.
Figure 4D:
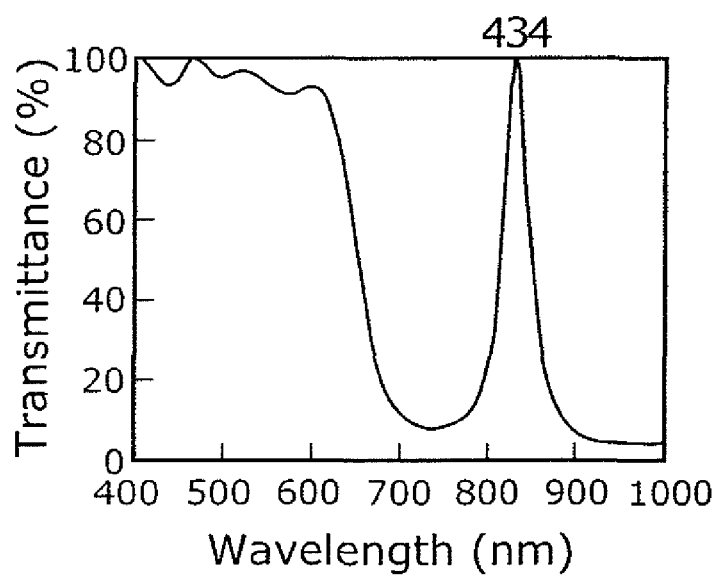
FIG. 4D illustrates the spectral characteristics of a near-infrared normalization filter 306b according to Embodiment 1 of the present invention.
Figure 4E:
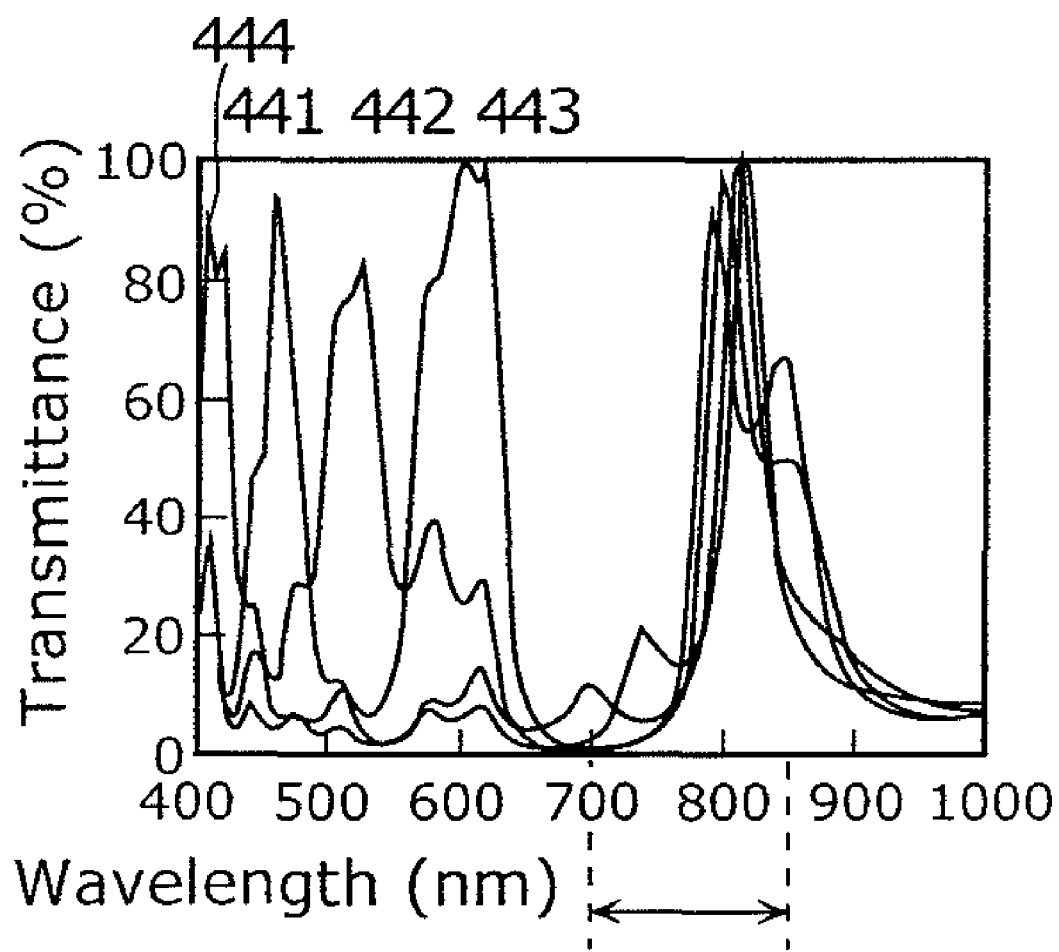
FIG. 4E illustrates the transmission characteristics of a color separation filter 306 according to Embodiment 1 of the present invention.

FIG. 4A illustrates a conceptual structure of the visible-light and near-infrared filter 306a, which allows color separation of visible light, of the color separation filter 306, and FIG. 4B illustrates the spectral characteristics of the visible-light and near-infrared filter 306a. FIG. 4C illustrates a conceptual structure of the near-infrared normalization filter 306b which allows selective transmission of visible light and near-infrared light passing through the visible-light and near-infrared filter 306a, and FIG. 4D illustrates the spectral characteristics of the near-infrared normalization filter 306b. FIG. 4E illustrates the spectral characteristics of the color separation filter 306 which includes the visible-light and near-infrared filter 306a and the near-infrared normalization filter 306b.

[Structure and Transmission Characteristics of Visible-Light and Near-Infrared Filter 306a]

The visible-light and near-infrared filter 306a has a layered structure described below.

When incident light has a set wavelength of $\lambda_1$ (530 [nm], for example), the visible-light and near-infrared filter 306a has two $\lambda/4$ multilayer films each of which is formed with layers that are having an optical thickness approximately equal to ¼ of the set wavelength $\lambda_1$ and are made of two types of materials with different refractive indices, namely, first layers made of a high refractive index material and second layers made of a low refractive index material. Here, "optical thickness" is a value obtained by multiplying a physical thickness by a refractive index.

More specifically, the visible-light and near-infrared filter 306a includes two $\lambda/4$ multilayer films, namely, a first $\lambda/4$ multilayer film in which a first layer 402, a second layer 403, and a first layer 404 are sequentially laminated, and a second $\lambda/4$ multilayer film in which a first layer 406, a second layer 407, and a first layer 408 are sequentially laminated. Formed between these two $\lambda/4$ multilayer films is a first spacer layer 405 made of a low refractive index material (also known as "defect layer" or "resonance layer").

As shown in FIG. 4A, the number of layers of the visible-light and near-infrared filter 306a is 7 in the pixel regions of blue (B), red (R), and near infrared (IR), and 5 in the region of green (G).

Among the layers made of two types of materials having different refractive indices, the first layers 402, 404, 406 and 408 are made of a high refractive index material made of, specifically, titanium dioxide ($TiO_2$), and the second layers 403 and 407 are made of a low refractive index material made of, specifically, silicon dioxide ($SiO_2$).

The first spacer layer 405 has an optical thickness according to light allowed to pass through for the unit pixels 201 of the visible-light and near-infrared filter 306a. Therefore, the physical thickness of the entire visible-light and near-infrared filter 306a also differs depending on light allowed to pass through for the unit pixels 201. The physical thickness of the visible-light and near-infrared filter 306a is 421 [nm], 390 [nm], 523 [nm], and 481 [nm] in the red (R) region, green (G) region, blue (B) region, and near-infrared (IR) region, respectively. Accordingly, the first spacer layer 405 is a layer used for controlling light transmission, and by changing the thickness of this layer, the light of red (R), blue (B), green (G), or near-infrared (IR) is allowed to pass through.

Further, in the visible-light and near-infrared filter 306a, the first layers 402, 404, 406, and 408 and the second layers 403 and 407 are formed with the same optical thickness in any region of red (R), blue (B), green (G), and near-infrared (IR).

Here, since the set wavelength $\lambda_1$ determining the thickness of the $\lambda/4$ films is 530 nm, the optical thickness of each of the first and second layers is 132.5 nm. With the wavelength of 530 nm, the refractive index of titanium dioxide is 2.53 and the refractive index of silicon dioxide is 1.48, and thus the physical thickness of each of the first layers made of titanium dioxide is 52 nm, and the physical thickness of each of the second layers is 91 nm.

To be more specific, one of the $\lambda/4$ multilayer films is formed with the first layers 402 and 404 of a high refractive index material made of titanium dioxide having the physical thickness of 52 [nm], and the second layer 403 of a low refractive index material made of silicon dioxide having the physical thickness of 91 [nm]. Further, the other one of the $\lambda/4$ multilayer films is formed with the first layers 406 and 408 of a high refractive index material made of titanium dioxide having the physical thickness of 52 [nm], and the second layer 407 of a low refractive index material made of silicon dioxide having the physical thickness of 91 [nm].

Furthermore, formed between the two $\lambda/4$ multilayer films is the first spacer layer 405 of a low refractive index material made of silicon dioxide, and it is different depending on light allowed to pass through; that is, it is different for each of the regions of blue (B), red (R), green (G), and near infrared (IR). To be more specific, the first spacer layer 405 is formed with different physical thicknesses depending on the regions, namely, 133 [nm] in the blue region, 31 [nm] in the red region, 0 [nm] in the green region, and 91 [nm] in the near-infrared region.

As described above, the visible-light and near-infrared filter 306a of the solid-state imaging device 102 is formed on a substrate 401. Further, a TEOS planarizing film 409 is formed on the visible-light and near-infrared filter 306a.

Thus, the above structure of the visible-light and near-infrared filter 306a allows color separation simply by changing the thickness of the first spacer layer 405.

FIG. 4B illustrates the spectral characteristics of the visible-light and near-infrared filter 306a according to Embodiment 1, and shows a design result calculated using a Matrix method. In the graph shown in FIG. 4B, the vertical axis represents transmittance, and the horizontal axis represents wavelengths of transmitted light. Furthermore, in FIG. 4B, graphs 411, 412, 413, and 414 show the spectral characteristics of the visible-light and near-infrared filter 306a in the blue region, green region, red region, and near-infrared region, respectively. It is to be noted that in FIG. 4B, the spectral characteristics are calculated with a set center wavelength $\lambda$ of 530 nm.

As shown in FIG. 4B, the visible-light and near-infrared filter 306a of the solid-state imaging device 102 allows color separation of RGB and IR, but has variation in RGB spectral characteristics with respect to light having wavelengths of 700 nm to 850 nm.

[Structure and Transmission Characteristics of Near-Infrared Normalization Filter]

The near-infrared normalization filter 306b has a layered structure described below. When incident light has a set wavelength of $\lambda_2$ (850 [nm], for example), the near-infrared normalization filter 306b has two $\lambda/4$ multilayer films each of which is formed with layers that are having an optical thickness approximately equal to ¼ of the set wavelength $\lambda_2$ and are made of two types of materials with different refractive indices, namely, third layers made of a high refractive index material and fourth layers made of a low refractive index material. More specifically, the near-infrared normalization filter 306b includes a first $\lambda/4$ multilayer film in which a third layer 422, a fourth layer 423, a third layer 424, a fourth layer 425, and a third layer 426 are sequentially laminated, and a second $\lambda/4$ multilayer film in which a third layer 427, a fourth layer 428, a third layer 429, a fourth layer 430, and a third layer 431 are sequentially laminated. Formed between these two $\lambda/4$ multilayer films is a second spacer layer 433 made of a low refractive index material.

Further, in order to improve the transmittance in the short wavelength region, $\lambda/8$ films 421 and 432 made of a low refractive index material are formed on the N-type semiconductor layer 301 side of the third layer 422 and on the collecting lens 307 side of the third layer 431, respectively.

Here, as shown in FIG. 4C, the number of layers of the near-infrared normalization filter 306b is 11 in the pixel regions of blue (B), red (R), green (G), and near-infrared (IR).

Among the layers made of two types of materials having different refractive indices, the third layers 422, 424, 426, 427, 429, and 431 are made of a high refractive index material which is made of, specifically, titanium dioxide ($TiO_2$), and the fourth layers 423, 425, 428, and 430 are made of a low refractive index material which is made of, specifically, silicon dioxide ($SiO_2$). The $\lambda/8$ films 421 and 432 are also made of a low refractive index material made of, specifically, silicon dioxide ($SiO_2$).

Further, in the near-infrared normalization filter 306b, the third layers 422, 424, 426, 427, 429, and 431, and the fourth layers 423, 425, 428, and 430 are formed with the same optical thickness in any regions of blue (B), red (R), green (G), and near-infrared (IR).

Here, since the set wavelength $\lambda_2$ determining the thickness of the $\lambda/4$ films is 850 nm, the optical thickness of each of the third and fourth layers is 212.5 nm. With the wavelength of 850 nm, the refractive index of titanium dioxide is 2.41 and the refractive index of silicon dioxide is 1.44, and thus the physical thickness of each of the third layers made of titanium dioxide is 88 nm, and the physical thickness of each of the fourth layers is 148 nm.

To be more specific, one of the $\lambda/4$ multilayer films is formed with the third layers 422, 424, and 426 of a high refractive index material made of titanium dioxide having the physical thickness of 88 [nm], and the fourth layers 423 and 425 of a low refractive index material made of silicon dioxide having the physical thickness of 148 [nm]. Further, the other one of the $\lambda/4$ multilayer films is formed with the third layers 427, 429 and 431 of a high refractive index material made of titanium dioxide having the physical thickness of 88 [nm], and the fourth layers 428 and 430 of a low refractive index material made of silicon dioxide having the physical thickness of 148 [nm]. Furthermore, $\lambda/8$ films 421 and 432 of a low refractive index material made of silicon dioxide having the physical thickness of 148 [nm] are formed on the N-type semiconductor layer 301 side of the third layer 422 and on the collecting lens 307 side of the third layer 431, respectively. Moreover, formed between the two $\lambda/4$ multilayer films is the second spacer layer 433 of a low refractive index material made of silicon dioxide having the physical thickness of 0 [nm].

FIG. 4D illustrates the spectral characteristics of the near-infrared normalization filter 306b according to Embodiment 1 of the present invention, and shows a design result calculated using a Matrix method. In the graph shown in FIG. 4D, the vertical axis represents transmittance, and the horizontal axis represents wavelengths of transmitted light. A graph 434 in FIG. 4D shows the spectral characteristics of the near-infrared normalization filter 306b in the near-infrared region. It is to be noted that in FIG. 4D, the spectral characteristics are calculated with a set center wavelength $\lambda$ of 850 nm.

As shown in FIG. 4D, the near-infrared normalization filter 306b is substantially transparent in the bands of the near-infrared light region and the visible light region, and in the band of the near-infrared light region where it is substantially transparent, the band-center wavelength is equal to or above 700 nm, and the band edge is at a wavelength of between 600 and 700 nm inclusive. Further, the bandwidth of the near-infrared light region where the near-infrared normalization filter 306b is substantially transparent is equal to or less than 100 nm; that is, the half width is approximately 50 nm, and the bandwidth around the bottom is equal to or less than 100 nm. As for the visible light region where the near-infrared normalization filter 306b is substantially transparent, the band edge is at a wavelength of between 600 and 700 nm inclusive, and it allows transmission of visible light having wavelengths equal to or less than 700 nm (here, RGB). Furthermore, as shown in FIG. 4D, the near-infrared normalization filter 306b is substantially not transparent in the near-infrared wavelength band of 700 to 800 nm. Here, "substantially transparent" means that the transmittance is 80% or above, and "substantially not transparent" means that the transmittance is 20% or below.

As described above, with the above structure of the near-infrared normalization filter 306b of the solid-state imaging device 102, it is possible to provide a filter that allows selective transmission of visible light and near-infrared light.

[Structure and Transmission Characteristics of Color Separation Filter]

The color separation filter 306 formed on the solid-state imaging device 102 has a structure in which the above described visible-light and near-infrared filter 306a and near-infrared normalization filter 306b are laminated. FIG. 4E illustrates the transmission characteristics of the color separation filter 306. It can be understood from FIG. 4E that with the color separation filter 306, in the wavelength region of the near-infrared region that is 700 nm and above (more specifically, in the region of 700 nm to 850 nm), the spectral characteristics of the red pixels, green pixels, blue pixels, and near-infrared pixels approximately match one another.

The solid-state imaging device 102 can make the RGB and IR spectral characteristics in the region of 700 nm to 850 nm approximately match one another by forming the color separation filter 306 by laminating the following filters: the visible-light and near-infrared filter 306a, which allows color separation of RGB and IR yet has variation in the RGB spectral characteristics in the region of 700 nm to 850 nm; and the near-infrared normalization filter 306b, which, as shown in FIG. 4D, has the characteristics of the substantially transparent near-infrared light region and visible light region and the characteristics of the substantially not transparent near-infrared region in the near-infrared wavelength band of 700 nm to 800 nm.

Therefore, by using the solid-state imaging device 102 of Embodiment 1, it is possible to achieve high color reproducibility by signal processing using signal output from the near-infrared light region as a reference signal, even in the case of using lighting of low color temperatures.

(Embodiment 2)

Figure 5:
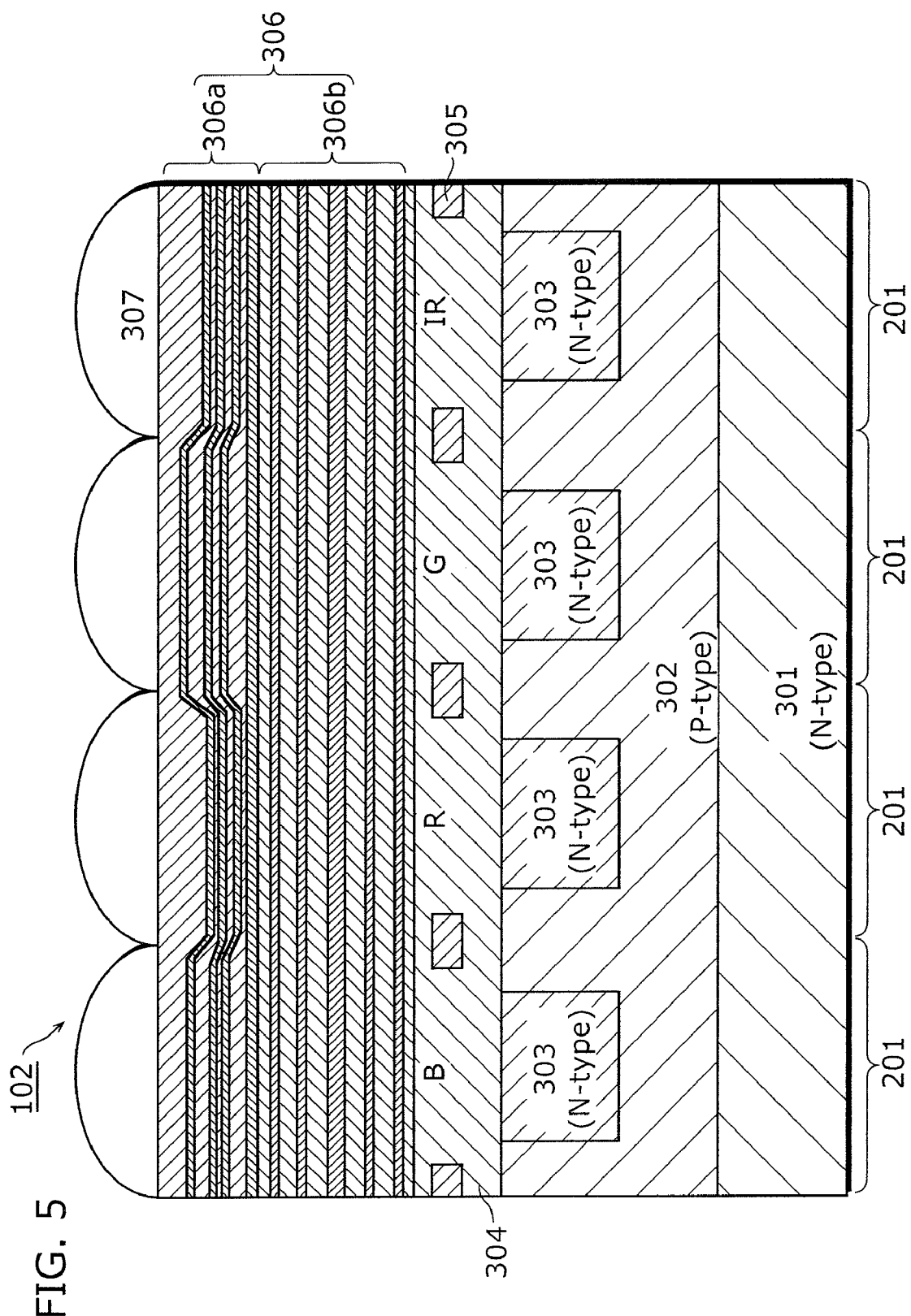
FIG. 5 is a cross-section diagram of unit pixels 201 of a solid-state imaging device 102 according to Embodiment 2 of the present invention.

FIG. 5 is a cross-section diagram of unit pixels 201 of a solid-state imaging device 102 according to Embodiment 2. The solid-state imaging device 102 of Embodiment 2 is different from that of Embodiment 1 in film structure of the visible-light and near-infrared filter 306a. The near-infrared normalization filter 306b and the other structure are the same as that in Embodiment 1 and thus the descriptions thereof shall be omitted.

FIGS. 6A to 6E illustrate the structure and spectral characteristics of a color separation filter 306 of the solid-state imaging device 102 according to Embodiment 2.

[Structure and Transmission Characteristics of Visible-Light and Near-Infrared Filter]

Figure 6A:
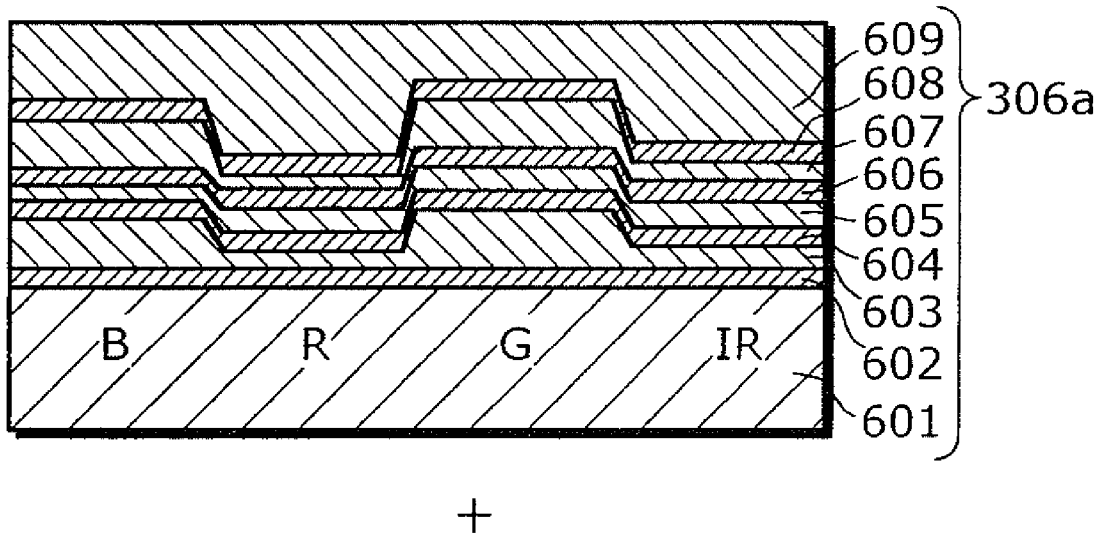
FIG. 6A illustrates a conceptual structure of a visible-light and near-infrared filter 306a, which allows color separation of visible light, of a color separation filter 306 according to Embodiment 2 of the present invention.

FIG. 6A illustrates a conceptual structure of a visible-light and near-infrared filter 306a, which allows color separation of visible light, of a color separation filter 306. The visible-light and near-infrared filter 306a has a layered structure described below.

When incident light has a set wavelength of $\lambda_1$ (530 [nm], for example), the visible-light and near-infrared filter 306a has a structure in which three layers (first layers 604 and 606, and a second layer 605) that are having an optical thickness approximately equal to ¼ of the set wavelength of $\lambda_1$ and are made of two types of materials with different refractive indices are sandwiched between first spacer layers (also known as "defect layers" or "resonance layers") 603 and 607, and this sandwiched structure is further sandwiched between first layers 602 and 608 which are the above mentioned $\lambda_1$/4 films. To put it differently, the first spacer layer 603 is formed between the first layers 602 and 604, and the first spacer layer 607 is formed between the first layers 606 and 608. That is, the visible-light and near-infrared filter 306a is formed with a three-layer film including the first layer 606, the first spacer layer 607, and the first layer 608, and another three-layer film including the first layer 602, the first spacer layer 603, and the first layer 604. Further, the second layer 605 is formed between the two three-layer films. Therefore, as shown in FIG. 6A, the number of layers is 7. Among the layers made of two types of materials having different refractive indices, the first layers 602, 604, 606, and 608 are made of a high refractive index material which is made of, specifically, titanium dioxide ($TiO_2$), and the second layer 605 are made of a low refractive index material which is made of, specifically, silicon dioxide ($SiO_2$).

The first spacer layers 607 and 603 have an optical thickness according to light allowed to pass through for the unit pixels 201 of the visible-light and near-infrared filter 306a. Therefore, the physical thickness of the entire visible-light and near-infrared filter 306a also differs depending on light allowed to pass through for the unit pixels 201. The physical thickness of the visible-light and near-infrared filter 306a is 389 [nm], 669 [nm], 579 [nm], and 481 [nm] in the regions of red (R), green (G), blue (B), and near-infrared (IR), respectively. That is to say, the first spacer layers 607 and 603 are layers used for controlling light transmission, and by changing the thicknesses of these layers, red (R), blue (B), green (G), or near-infrared (IR) light is allowed to pass through.

Further, in the visible-light and near-infrared filter 306a, the first layers 602, 604, 606, and 608, and the second layer 605 are formed with the same optical thickness in any regions of red (R), green (G), blue (B), and near infrared (IR).

Here, since the set wavelength $\lambda_1$ determining the thickness of the $\lambda/4$ film is 530 nm, the optical thickness of each of the first and second layers is 132.5 nm. With the wavelength of 530 nm, the refractive index of titanium dioxide is 2.53 and the refractive index of silicon dioxide is 1.48, and thus the physical thickness of each of the first layers made of titanium dioxide is 52 nm, and the physical thickness of the second layer is 91 nm.

To be more specific, a $\lambda/4$ multilayer film is formed with the first layers 604 and 606 of a high refractive index material made of titanium dioxide having the physical thickness of 52 [nm], and the second layer 605 of a low refractive index material made of silicon dioxide having the physical thickness of 91 [nm]. On both sides of the $\lambda/4$ multilayer film, that is, on the N-type semiconductor layer 301 side of the first layer 604 and on the collecting lens 307 side of the first layer 606, the first spacer layers 603 and 607 which are made of a low refractive index material having the same optical thickness for each unit pixel 201 are formed, respectively.

The first spacer layers 603 and 607 are different depending on light allowed to pass through, that is, different for each region of blue (B), red (R), green (G), and near infrared (IR). To be more specific, the first spacer layers 603 and 607 are formed with different physical thicknesses depending on the regions, namely, 140 [nm] in the blue region, 45 [nm] in the red region, 182 [nm] in the green region, and 91 [nm] in the near-infrared region.

Moreover, on the N-type semiconductor layer 301 side of the first spacer layer 603 and on the collecting lens 307 side of the first spacer layer 607, the first layers 602 and 608 of a high refractive index material made of titanium dioxide having the physical thickness of 52 [nm] are formed, respectively.

As described above, the visible-light and near-infrared filter 306a of the solid-state imaging device 102 is formed on a substrate 601. Further, a TEOS planarizing film 609 is formed on the visible-light and near-infrared filter 306a. Here, the above mentioned set wavelength "$\lambda_1$" is 530 [nm].

Thus, the above structure of the visible-light and near-infrared filter 306a allows color separation simply by changing the thicknesses of the first spacer layers 603 and 607.

Figure 6B:
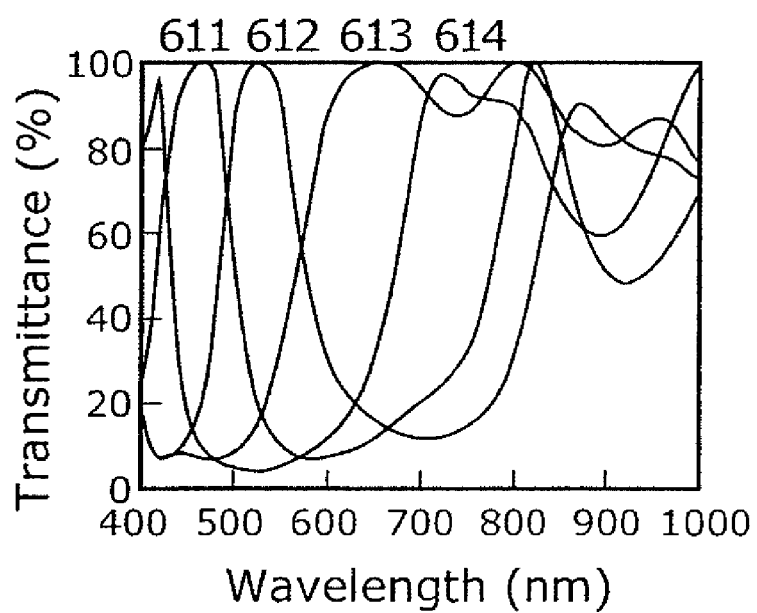
FIG. 6B illustrates the spectral characteristics of a visible-light and near-infrared filter 306a according to Embodiment 2 of the present invention.
Figure 6C:
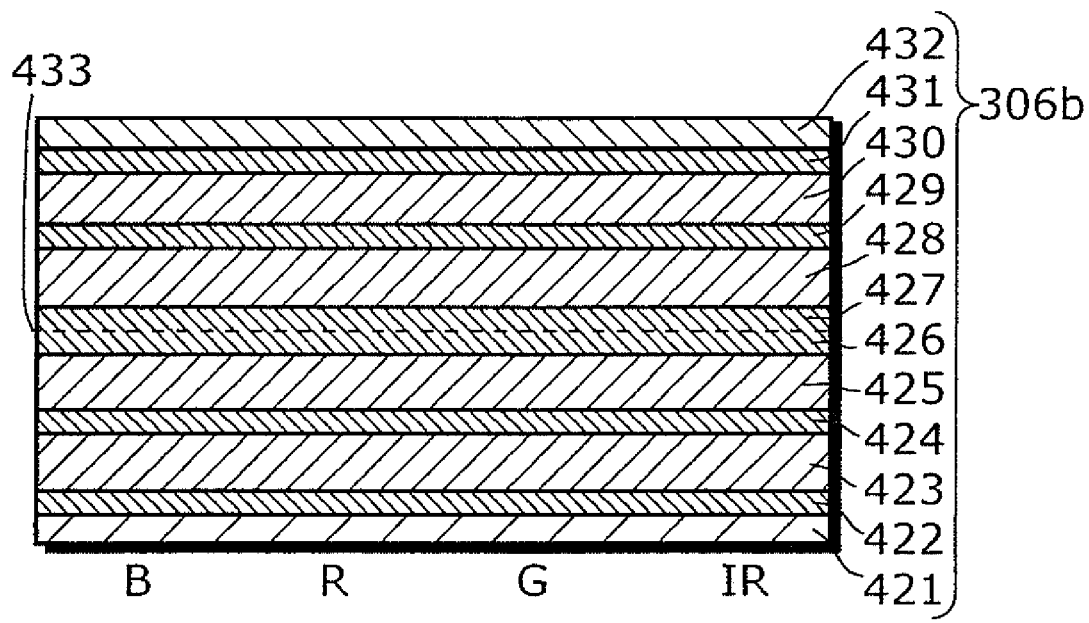
FIG. 6C illustrates a conceptual structure of a near-infrared normalization filter 306b which allows selective transmission of visible light and near-infrared light passing through a visible-light and near-infrared filter 306a according to Embodiment 2 of the present invention.

FIG. 6B illustrates the spectral characteristics of the visible-light and near-infrared filter 306a according to Embodiment 2 of the present invention, and shows a design result calculated using a Matrix method. In the graph shown in FIG. 6B, the vertical axis represents transmittance, and the horizontal axis represents wavelengths of transmitted light. Furthermore, in FIG. 6B, graphs 611, 612, 613, and 614 show the spectral characteristics of the visible-light and near-infrared filter 306a in the regions of blue, green, red, and near infrared, respectively.

Here, it is apparent from comparison with Embodiment 1 that the RGB transmission bands have widened.

That is to say, in comparison with the visible-light and near-infrared filter 306a according to Embodiment 1, the visible-light and near-infrared filter 306a according to Embodiment 2 has two first spacer layers, thereby increasing the number of processes for forming the multilayer film; that is, the number of processes increases, resulting in slight deterioration in the processability. However, there is an advantageous effect that the RGB colors are well reproducible. It is to be noted that in FIG. 6B, the spectral characteristics are calculated with a set center wavelength λ of 530 nm.

As shown in FIG. 6B, the visible-light and near-infrared filter 306a of the solid-state imaging device 102 allows color separation of RGB and IR, but has variation in RGB spectral characteristics with respect to light having wavelengths 700 nm to 850 nm.

[Structure and Transmission Characteristics of Color Separation Filter]

The color separation filter 306 formed on the solid-state imaging device 102 has a structure in which the above described visible-light and near-infrared filter 306a and near-infrared normalization filter 306b are laminated. FIG. 6E illustrates the transmission characteristics of the color separation filter 306. It can be understood from FIG. 6E that in the wavelength region of the near-infrared region that is 700 nm and above (more specifically, in the region of 700 nm to 850 nm), the spectral characteristics of the color separation filter 306 in the red region, the green region, the blue region, and the near-infrared region approximately match one another.

Figure 6D:
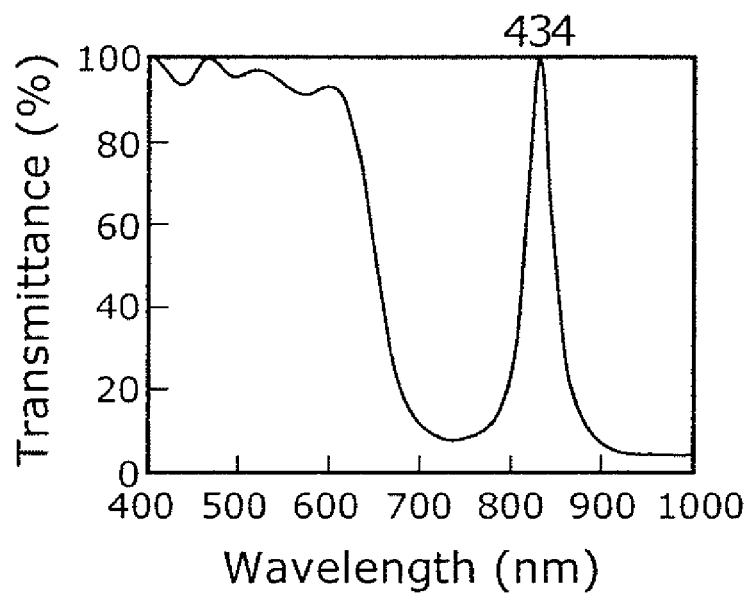
FIG. 6D illustrates the spectral characteristics of a near-infrared normalization filter 306b according to Embodiment 2 of the present invention.
Figure 6E:
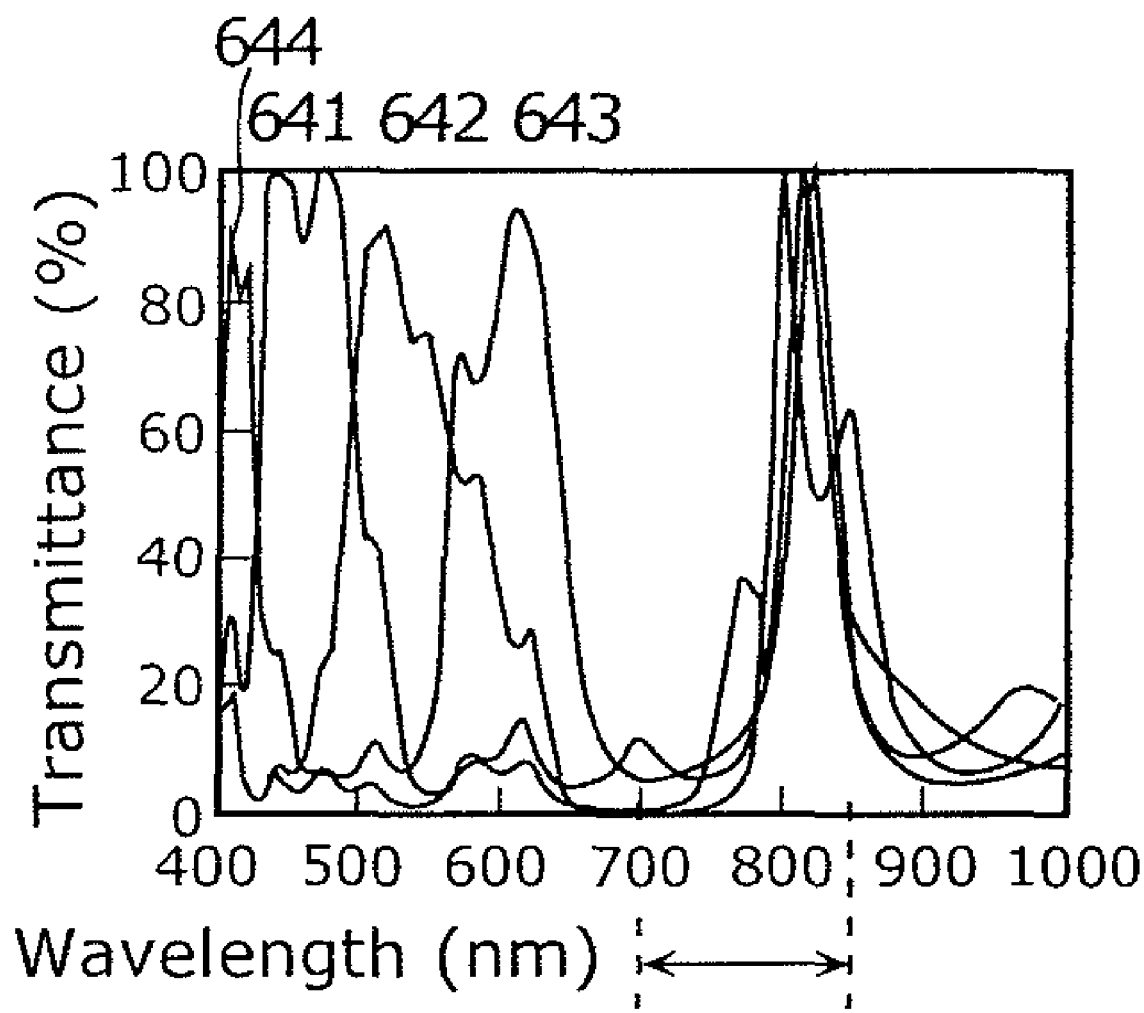
FIG. 6E illustrates the transmission characteristics of a color separation filter 306 according to Embodiment 2 of the present invention.

The solid-state imaging device 102 can make the RGB and IR spectral characteristics in the region of 700 nm to 850 nm approximately match one another by forming the color separation filter 306 by laminating the following filters: the visible-light and near-infrared filter 306a, which allows color separation of RGB and IR yet has variation in RGB spectral characteristics in the region of 700 nm to 850 nm; and the near-infrared normalization filter 306b, which, as shown in FIG. 6D, has the characteristics of the substantially transparent near-infrared light region and visible light region and the characteristics of the substantially not transparent near-infrared region in the near-infrared wavelength band of 700 nm to 800 nm.

Therefore, by using the solid-state imaging device 102 of Embodiment 2, it is possible to achieve high color reproducibility by signal processing using signal output from the near-infrared light region as a reference signal, even in the case of using lighting of low color temperatures.

(Embodiment 3)

FIGS. 7A to 7E illustrate the structure and spectral characteristics of a color separation filter 306 of a solid-state imaging device 102 according to Embodiment 3. The solid-state imaging device 102 in Embodiment 3 is different from that in Embodiment 2 in that a second spacer layer 433 is inserted in the R pixel (pixel in the red region) of the near-infrared normalization filter 306b. The other structure is the same as that in Embodiment 2 and thus the description thereof shall be omitted.

[Structure and Transmission Characteristics of Near-Infrared Normalization Filter]

The near-infrared normalization filter 306b has a layered structure described below. When incident light has a set wavelength of $\lambda_2$ (850 [nm], for example), the near-infrared normalization filter 306b has two λ/4 multilayer films each of which is formed with layers that are having an optical thickness of approximately ¼ of the set wavelength of $\lambda_2$ and are made of two types of materials with different refractive indices, namely, third layers made of a high refractive index material and fourth layers made of a low refractive index material. More specifically, the near-infrared normalization filter 306b includes a first λ/4 multilayer film in which a third layer 422, a fourth layer 423, a third layer 424, a fourth layer 425, and a third layer 426 are sequentially laminated, and a second λ/4 multilayer film in which a third layer 427, a fourth layer 428, a third layer 429, a fourth layer 430, and a third layer 431 are sequentially laminated. Formed between these two λ/4 multilayer films is a second spacer layer 433 made of a low refractive index material.

Further, in order to improve the transmittance of the short wavelength region, λ/8 films 421 and 432 made of a low refractive index material are formed on the N-type semiconductor layer 301 side of the third layer 422 and on the collecting lens 307 side of the third layer 431, respectively.

Figure 7A:
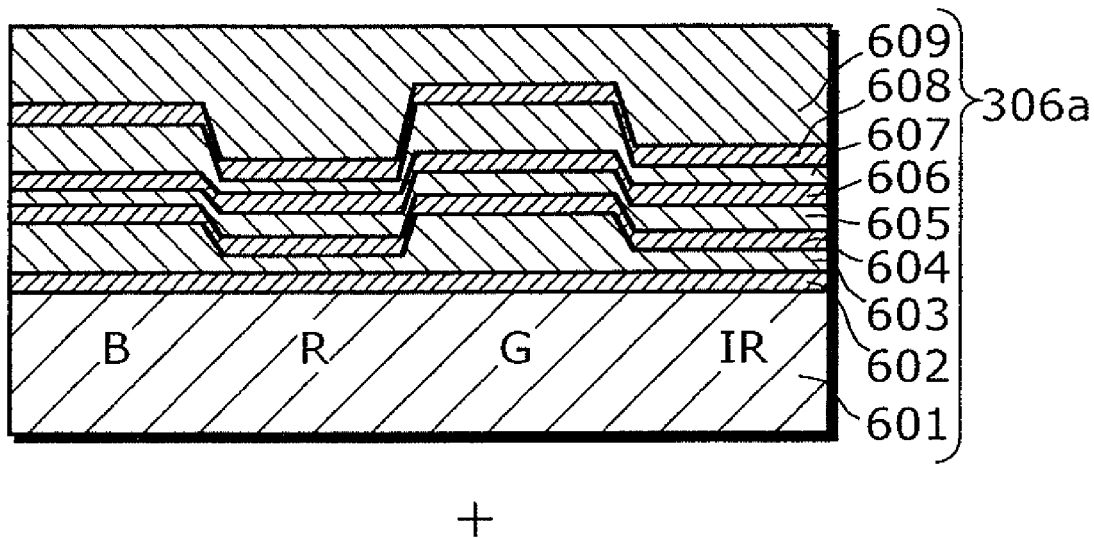
FIG. 7A illustrates a conceptual structure of a visible-light and near-infrared filter 306a, which allows color separation of visible light, of a color separation filter 306 according to Embodiment 3 of the present invention.
Figure 7B:
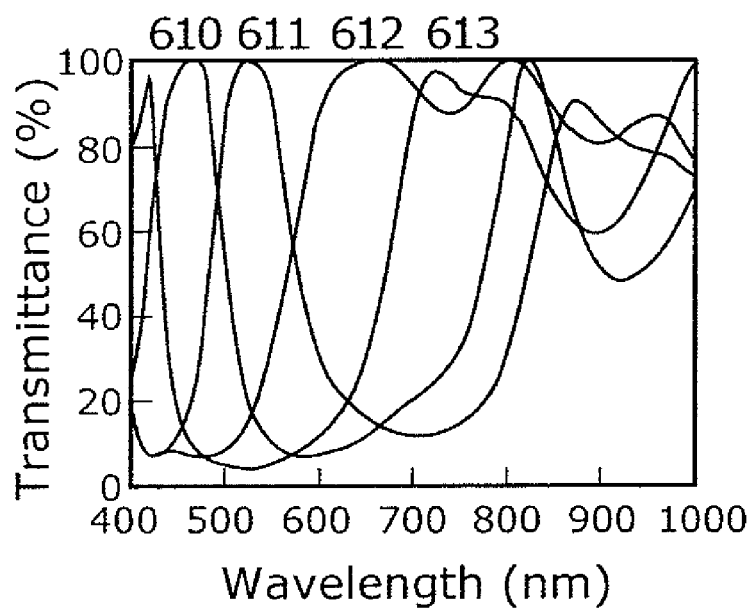
FIG. 7B illustrates the spectral characteristics of a visible-light and near-infrared filter 306a according to Embodiment 3 of the present invention.
Figure 7C:
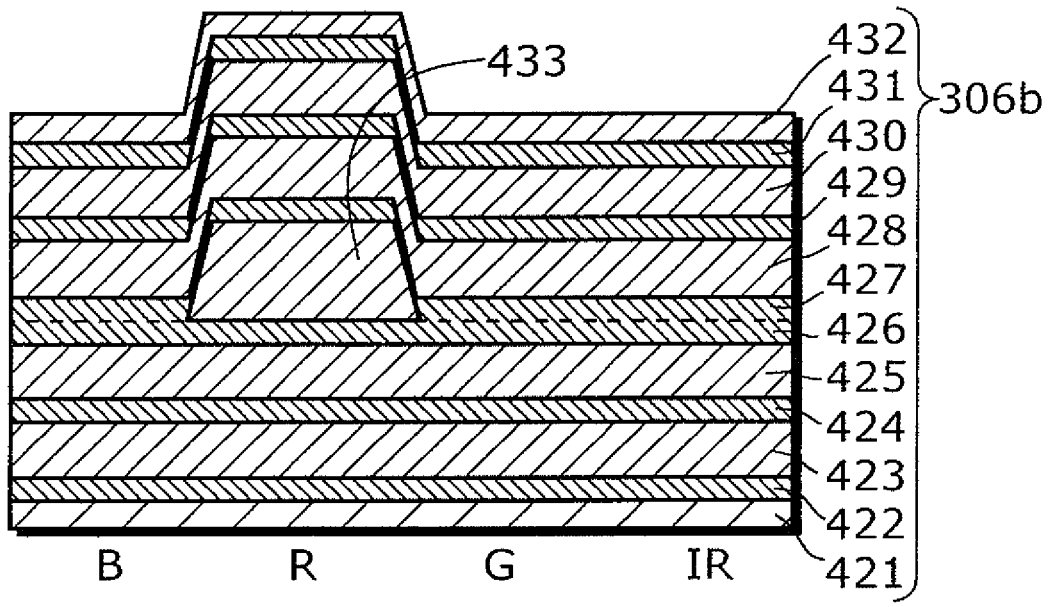
FIG. 7C illustrates a conceptual structure of a near-infrared normalization filter 306b which allows selective transmission of visible light and near-infrared light passing through a visible-light and near-infrared filter 306a according to Embodiment 3 of the present invention.

Here, as shown in FIG. 7C, the number of layers of the near-infrared normalization filter 306b is 11 in the pixel regions of blue (B), green (G), and near infrared (IR), and is 13 in the pixel region of red (R).

Among the layers made of two types of materials having different refractive indices, the third layers 422, 424, 426, 427, 429, and 431 are made of a high refractive index material which is made of, specifically, titanium dioxide ($TiO_2$), and the fourth layers 423, 425, 428, and 430 are made of a low refractive index material which is made of, specifically, silicon dioxide ($SiO_2$). The second spacer layer 433 is made of a low refractive index material which is made of, specifically, silicon dioxide ($SiO_2$). The λ/8 films 421 and 432 are also made of a low refractive index material which is made of, specifically, silicon dioxide ($SiO_2$).

Further, the near-infrared normalization filter 306b is formed with the third layers 422, 424, 426, 427, 429, and 431, and the fourth layers 423, 425, 428, and 430 having the same optical thickness in any regions of blue (B), red (R), green (G), and near infrared (IR), except for the second spacer layer 433.

Here, since the set wavelength $\lambda_2$ determining the thickness of the λ/4 films is 850 nm, the optical thickness of each of the third and fourth layers is 212.5 nm. With the wavelength of 850 nm, the refractive index of titanium dioxide is 2.41 and the refractive index of silicon dioxide is 1.44, and thus the physical thickness of each of the third layers made of titanium dioxide is 88 nm, and the physical thickness of each of the fourth layers is 148 nm.

To be more specific, one of the λ/4 multilayer films is formed with the third layers 422, 424, and 426 of a high refractive index material made of titanium dioxide having the physical thickness of 88 [nm], and the fourth layers 423 and 425 of a low refractive index material made of silicon dioxide having the physical thickness of 148 [nm]. Further, the other one of the λ/4 multilayer films is formed with the third layers 427, 429 and 431 of a high refractive index material made of titanium dioxide having the physical thickness of 88 [nm], and the fourth layers 428 and 430 of a low refractive index material made of silicon dioxide having the physical thickness of 148 [nm]. Furthermore, the λ/8 films 421 and 432 made of a low refractive index material made of silicon dioxide having the physical thickness of 148 [nm] are formed on the N-type semiconductor layer 301 side of the third layer 422 and on the collecting lens 307 side of the third layer 431, respectively.

Moreover, formed between the two λ/4 multilayer films is the second spacer layer 433 of a low refractive index material made of silicon dioxide, and the optical thickness of the second spacer layer 433 is different between the blue (B), green (G), and near-infrared (IR) regions, and the red region (R). Since the optical thickness is different, the physical thickness is also different; more specifically, the second spacer layer 433 is formed with different physical thicknesses depending on the regions, namely, 0 [nm] in the regions of blue, green, and near infrared, and 296 nm in the red region.

Here, the red region of the second spacer layer 433 is structured with an optical thickness obtained by two λ/4 films. Two λ/4 films are included because an optical thickness obtained by only one λ/4 film, for example, results in a change in the properties. To ensure symmetry so as not to change the properties, it is structured with an optical thickness obtained by two λ/4 films so that the spectral characteristics become the same as those obtained in the case where the optical thickness of the red region (R) is equal to that of the regions of blue (B), green (G), and near infrared (IR); that is, the spectral characteristics become the same as those obtained in the case of the optical thickness obtained by 0 λ/4 films (that is, not included).

Figure 7D:
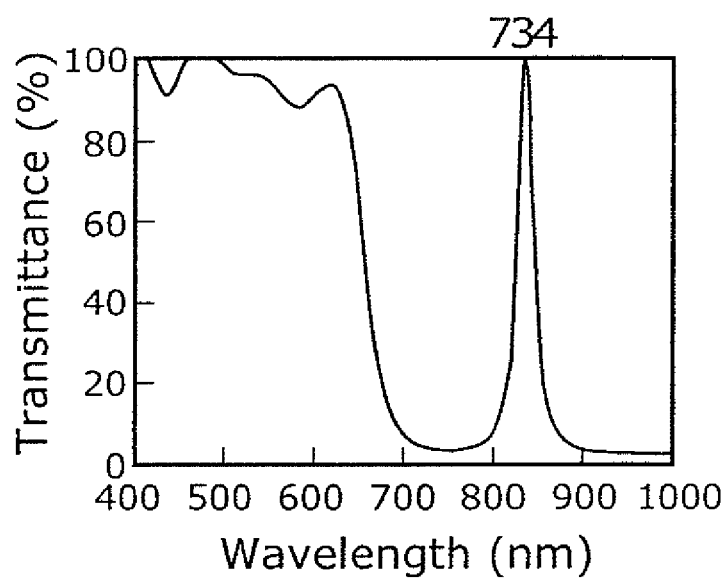
FIG. 7D illustrates the spectral characteristics of a near-infrared normalization filter 306b according to Embodiment 3 of the present invention.

FIG. 7D illustrates the spectral characteristics of the near-infrared normalization filter 306b according to Embodiment 3 of the present invention, and shows a design result calculated using a Matrix method. In the graph shown in FIG. 7D, the vertical axis represents transmittance, and the horizontal axis represents wavelengths of transmitted light. In FIG. 7D, a graph 734 shows the spectral characteristics of the near-infrared normalization filter 306b. It is to be noted that in FIG. 7D, the spectral characteristics are calculated with a set center wavelength λ of 850 nm.

As shown in FIG. 7D, as with the near-infrared normalization filter 306b of Embodiments 1 and 2, the near-infrared normalization filter 306b has the characteristics of the substantially transparent near-infrared light region and visible light region and the characteristics of the substantially not transparent near-infrared region in the near-infrared wavelength band of 700 to 800 nm.

As described above, with the above structure of the near-infrared normalization filter 306b of the solid-state imaging device 102, it is possible to provide a filter that allows selective transmission of visible light and near-infrared light.

[Structure and Transmission Characteristics of Color Separation Filter]

Figure 7E:
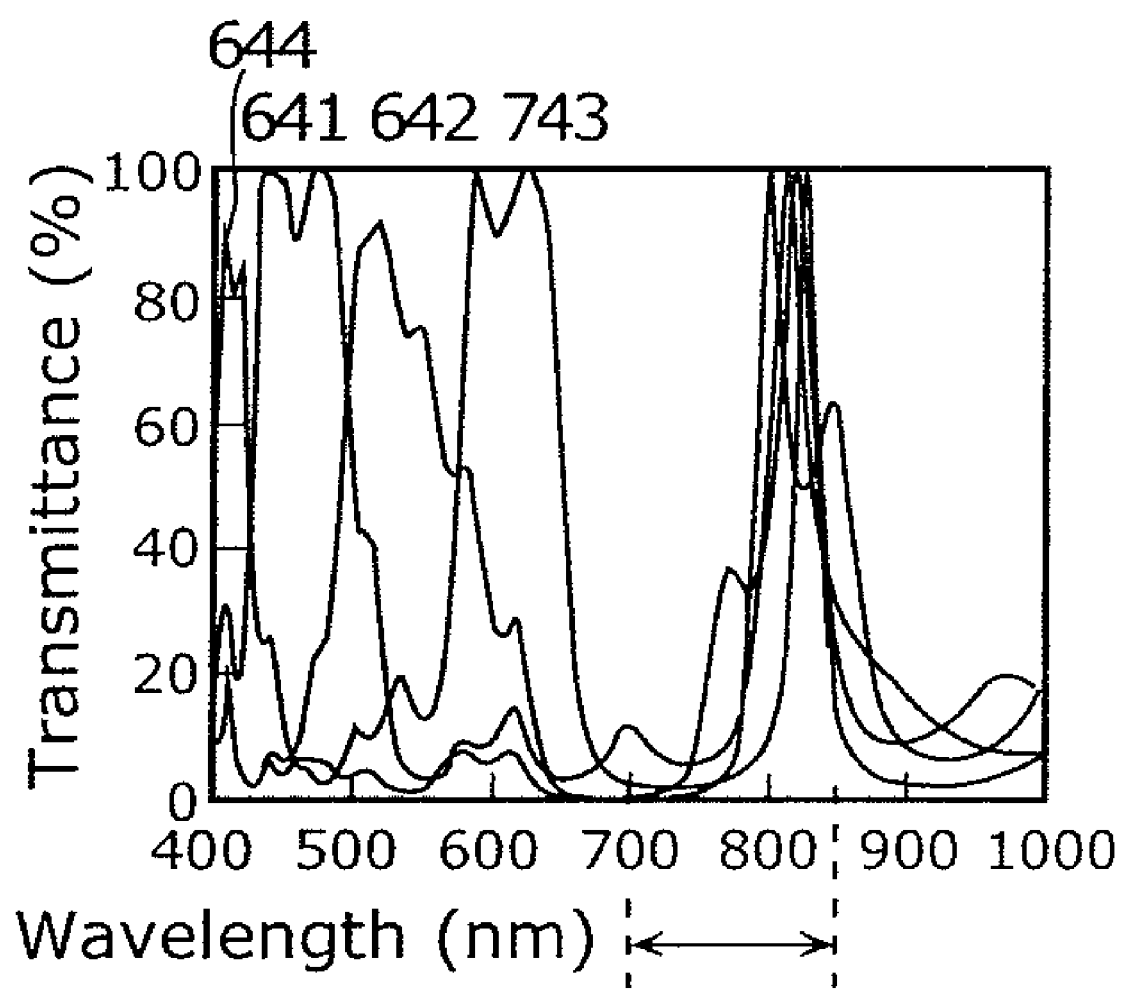
FIG. 7E illustrates the transmission characteristics of a color separation filter 306 according to Embodiment 3 of the present invention.

The color separation filter 306 formed in the solid-state imaging device 102 has a structure in which the above described visible-light and near-infrared filter 306a and near-infrared normalization filter 306b are laminated. FIG. 7E illustrates the transmission characteristics of the color separation filter 306. It can be understood from FIG. 7E that in the wavelength region of the near-infrared region that is 700 nm and above (more specifically, in the region of 700 nm to 850 nm), the spectral characteristics of the color separation filter 306 in the regions of red, green, blue, and near infrared approximately match one another.

As in Embodiments 1 and 2, the solid-state imaging device 102 can make the RGB and IR spectral characteristics in the region of 700 nm to 850 nm approximately match one another by forming the color separation filter 306 by laminating the following filters: the visible-light and near-infrared filter 306a, which allows color separation of RGB and IR yet has variation in the RGB spectral characteristics in the region of 700 nm to 850 nm; and the near-infrared normalization filter 306b, which, as shown in FIG. 7D, has the characteristics of the substantially transparent near-infrared light region and visible light region and the characteristics of the substantially not transparent near-infrared region in the near-infrared wavelength band of 700 nm to 800 nm.

Therefore, by using the solid-state imaging device 102 of Embodiment 3, it is possible to achieve high color reproducibility by signal processing using signal output from the near-infrared light region as a reference signal, even in the case of using lighting of low color temperatures.

In addition, by making the thickness of the second spacer layer 433 of the near-infrared normalization filter 306b in the red region, 296 nm, the maximum thickness difference between filters becomes 188 nm, which is found between the green region and the near-infrared region. In Embodiment 1, the maximum thickness difference is 280 nm, which is found between the green region and the red region, but in Embodiment 3, the maximum thickness difference can be reduced by 92 nm. Thus, the process of planarizing the device, performed after forming the color separation filter 306, can be made easier.

(Variations)

Thus far, the present invention has been described based on embodiments, but it is apparent that the present invention is not to be limited to the above embodiments, and that variations such as the following can also be implemented.

(1) The above embodiments have illustrated the case of using titanium dioxide as the material of the high refractive index layers, but it is apparent that the present invention is not limited to this, and instead, the following may be used. In other words, instead of using titanium dioxide as the material of the high refractive index layers, other materials such as silicon nitride ($Si_3N_4$), di-tantalum trioxide ($Ta_2O_3$), and zirconium dioxide ($ZrO_2$) may be used. Further, as the material of the low refractive index layers, materials other than silicon dioxide may be used. Regardless of the materials used for the multilayer interference filter, the effect of the present invention can be obtained.

(2) In the above embodiments, the visible-light and near-infrared filter 306a has a structure including one or two spacer layers, and the near-infrared normalization filter 306b has a structure including one spacer layer; however the visible-light and near-infrared filter 306a may have three or more spacer layers. Similarly, the near-infrared normalization filter 306b may have two or more spacer layers.

(3) The above embodiments have illustrated the case of providing one or two spacer layers regardless of the color of light allowed to pass through; however it is apparent that the present invention is not limited to this, and instead, the number of spacer layers may be changed according to the color of light allowed to pass through.

(4) The above embodiments have illustrated the case where the visible-light and near-infrared filter 306a has 5 or 7 layers, but it is apparent that the present invention is not limited to this. Furthermore, although it has been described that the λ/4 multilayer films of the near-infrared normalization filter 306b have a five-layered structure, the number of layers may be less than or greater than 5.

(5) The above embodiments have illustrated the case where the thicknesses of the two types of spacer layers are the same for each unit pixel 201, but it is apparent that the present invention is not limited to this, and the thicknesses of the spacer layers may be different.

(6) The above embodiments have illustrated the case where the visible-light and near-infrared filter 306a has a symmetrical structure; however it is apparent that the present invention is not limited to this, and an asymmetrical structure may be adopted although the transmittance will not be 100%.

(7) The above embodiments have illustrated the case of using silicon dioxide as the material of the spacer layers; however it is apparent that the present invention is not limited to this, and other materials may be used instead. As the material of the spacer layers, the same material as one of the high refractive index layer and the low refractive index layer, which constitute the dielectric layer, may be used, or a material different from any of these layers may be used. Moreover, as described above, the materials of the two defect layers may be different from each other.

(8) Although not specifically stated in the above embodiments, pixels for each color may be arranged in the Bayer pattern with R, G, B, and IR, for example. Alternatively, the density of the IR pixels may be varied as necessary.

(9) The XYZ system filter (visual sensitivity filter) disclosed in Japanese Unexamined Patent Application Publication No. 2008-306070 (Inventor: Koyama) is applicable to the above embodiments.

Here, the visual sensitivity filter is a filter that allows reproduction of a characteristic V ($\lambda$) of the CIE standard spectral luminous efficiency in association with the human visual sensitivity.

Figure 8A:
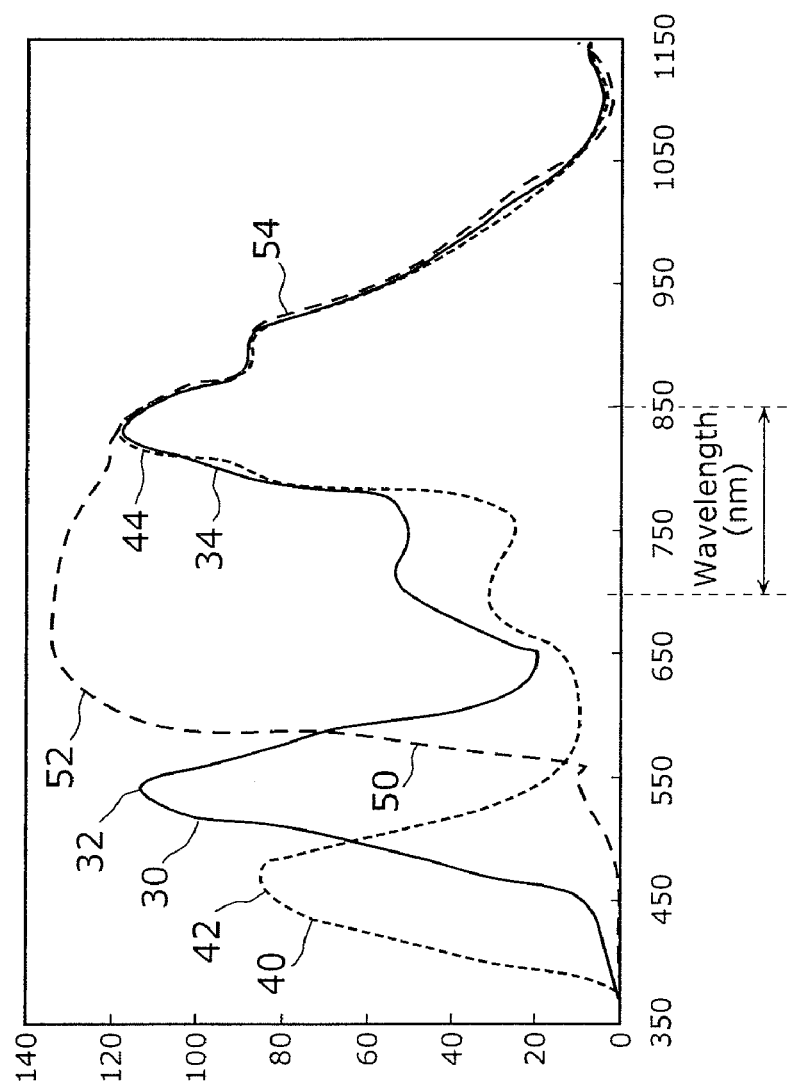
FIG. 8A is a diagram related to a solid-state imaging device according a conventional art.
Figure 8B:
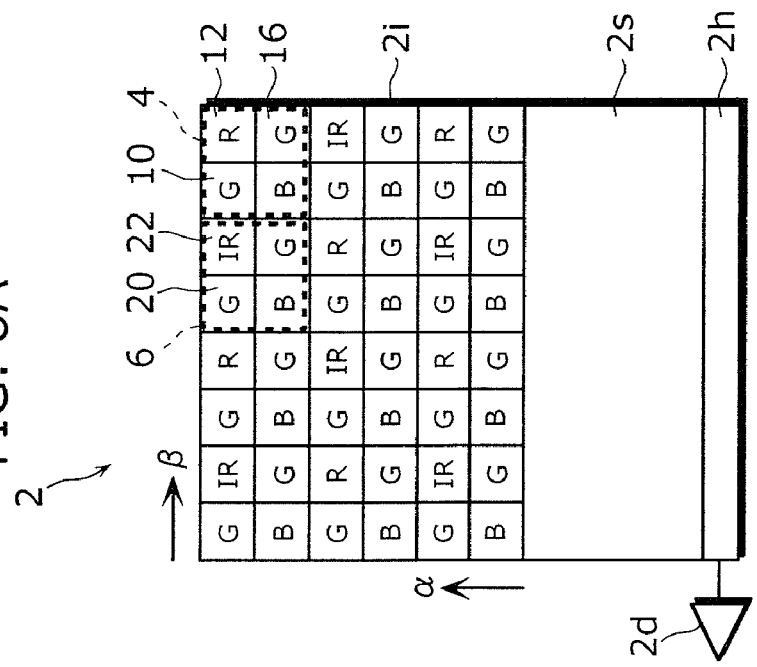
FIG. 8B is a diagram related to a solid-state imaging device according a conventional art.
Figure 9A:
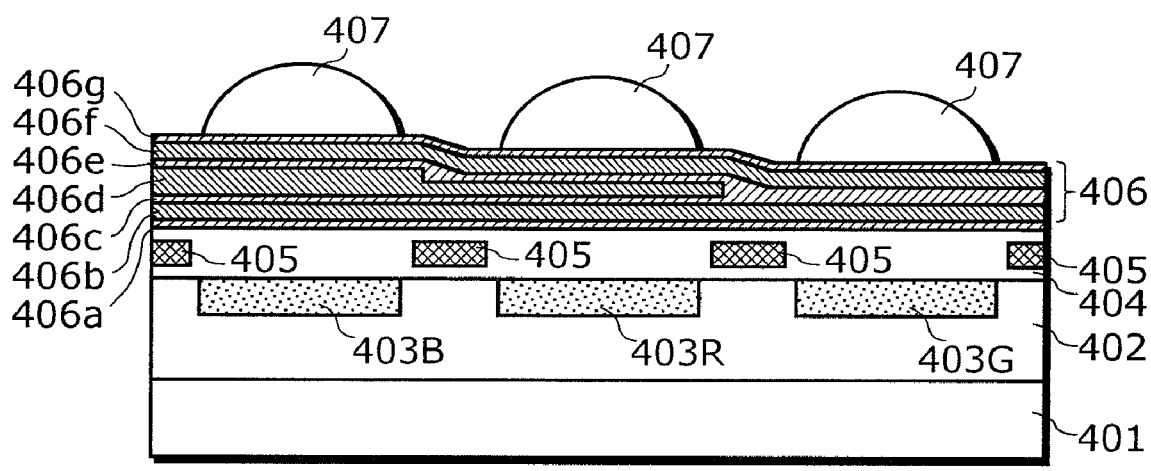
FIG. 9A is a diagram related to a solid-state imaging device according a conventional art.
Figure 9B:
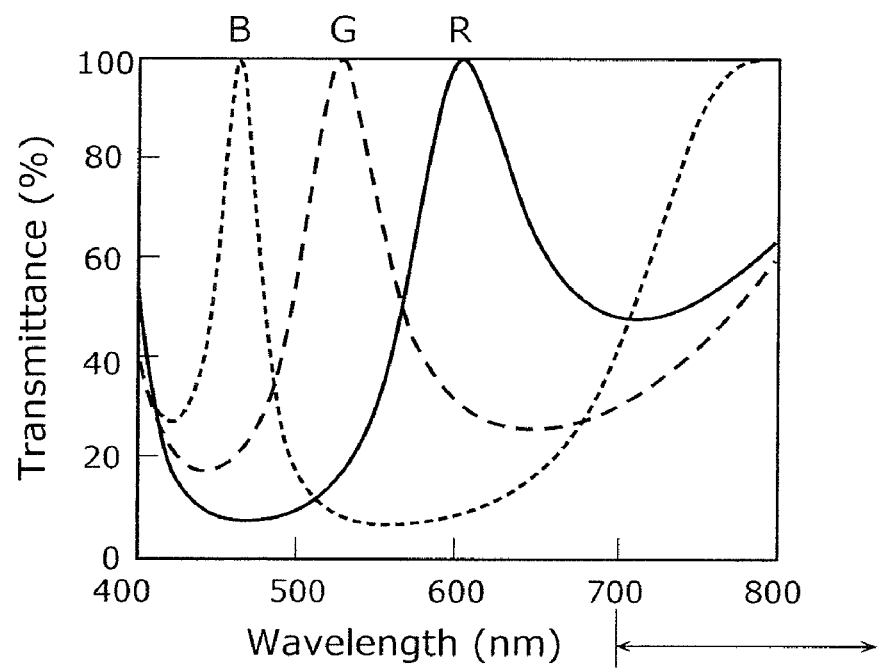
FIG. 9B is a diagram related to a solid-state imaging device according a conventional art.

(10) The above embodiments have illustrated the examples of the solid-state imaging device 102 having a dielectric multilayer film filter, but the present invention is not limited to this. The present invention is also applicable to, for example, an organic-material film filter described in FIGS. 8A and 8B.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Industrial Applicability

The solid-state imaging device and camera according to the present invention are useful as technology that allows high color reproducibility without causing a color shift even when using lighting of low color temperatures.

What is claimed is:

1. A solid-state imaging device having a plurality of pixels arranged two-dimensionally, said solid-state imaging device comprising
a color separation filter which allows transmission of light of a predetermined wavelength of incident light for each of said plurality of pixels,
wherein said color separation filter includes:
an RGB filter, in which a visible wavelength band and a first near-infrared wavelength band that is normalized are substantially transparent, and a second near-infrared wavelength band between the visible wavelength band and the first near-infrared wavelength band is substantially not transparent; and
an IR filter in which the first near-infrared wavelength band is substantially transparent and the second near-infrared wavelength band is substantially not transparent.

2. The solid-state imaging device according to claim 1, wherein a bandwidth of the first near-infrared wavelength band is equal to or less than 100 nm.

3. The solid-state imaging device according to claim 1, wherein a band-center wavelength of the first near-infrared wavelength band is equal to or more than 700 nm.

4. The solid-state imaging device according to claim 1, wherein an edge of the second near-infrared wavelength band on a shorter wavelength side is at a wavelength of between 600 and 700 nm inclusive.

5. A solid-state imaging device, comprising:
a plurality of pixels arranged two-dimensionally; and
a color separation filter which allows transmission of light of a predetermined wavelength of incident light for each of said plurality of pixels,
wherein said color separation filter includes:
a visible-light and near-infrared filter having transmission bands in regions of a visible wavelength band and a near-infrared wavelength band; and
a near-infrared normalization filter that is laminated with said visible-light and near-infrared filter,
wherein said near-infrared normalization filter is substantially transparent in the visible wavelength band and a first near-infrared wavelength band, and is substantially not transparent in a second near-infrared wavelength band between the visible wavelength band and the first near-infrared wavelength band,
said visible-light and near-infrared filter is a multilayer interference filter, and
when a set wavelength which is set in relation to the light of the predetermined wavelength is $\lambda_1$, said multilayer interference filter includes:
a first layer type of a high refractive index material having an optical thickness of $\lambda_1/4$;
a second layer type of a low refractive index material having an optical thickness of $\lambda_1/4$ which is equal to the optical thickness of said first layer type;
two $\lambda_1/4$ multilayer films each of which includes layers of said first layer type and said second layer type; and
a first spacer layer between said two $\lambda_1/4$ multilayer films and controls transmission of the light of the predetermined wavelength for each of said plurality of pixels.

6. The solid-state imaging device according to claim 5, comprising
at least a first pixel and a second pixel as said plurality of pixels,
wherein said first spacer layer corresponding to said first pixel has an optical thickness different from an optical thickness of said first spacer layer corresponding to said second pixel.

7. The solid-state imaging device according to claim 5, comprising
a first pixel, a second pixel, a third pixel, and a fourth pixel as said plurality of pixels,
wherein each of said first layer type and said second layer type has an optical thickness of $\lambda_1/4$,
said first spacer layer has four different optical thicknesses at said first pixel, said second pixel, said third pixel, and said fourth pixel,
said first spacer layer at said first pixel has an optical thickness of 0,
said first spacer layer at said second pixel has an optical thickness of between 0 and $\lambda_1/4$ inclusive,
said first spacer layer at said third pixel has an optical thickness approximately equal to $\lambda_1/4$, and
said first spacer layer at said fourth pixel has an optical thickness of between $\lambda_1/4$ and $\lambda_1/2$ inclusive.

8. A solid-state imaging device, comprising:
a plurality of pixels arranged two-dimensionally; and a color separation filter which allows transmission of light of a predetermined wavelength of incident light for each of said plurality of pixels, wherein said color separation filter includes:

a visible-light and near-infrared filter having transmission bands in regions of a visible wavelength band and a near-infrared wavelength band; and a near-infrared normalization filter that is laminated with said visible-light and near-infrared filter, wherein said near-infrared normalization filter is substantially transparent in the visible wavelength band and a first near-infrared wavelength band, and is substantially not transparent in a second near-infrared wavelength band between the visible wavelength band and the first near-infrared wavelength band, said visible-light and near-infrared filter is a multilayer interference filter, and when a set wavelength which is set in relation to the light of the predetermined wavelength is $\lambda_1$, said multilayer interference filter includes:

a first layer type of a high refractive index material having an optical thickness of $\lambda_1/4$;

a second layer type of a low refractive index material having an optical thickness of $\lambda_1/4$ which is equal to the optical thickness of said first layer; and a first spacer layer which controls transmission of the light of the predetermined wavelength for each of said plurality of pixels, and said multilayer interference filter includes a plurality of three-layered films, and said second layer is between said plurality of three-layered films, each of said three-layered films including one layer of said first layer type, said first spacer layer, and another one layer of said first layer type which are laminated in this order.

9. The solid-state imaging device according to claim 8, comprising at least a first pixel and a second pixel as said plurality of pixels, wherein said first spacer layer corresponding to said first pixel has an optical thickness different from an optical thickness of said first spacer layer corresponding to said second pixel.

10. The solid-state imaging device according to claim 8, comprising a first pixel, a second pixel, a third pixel, and a fourth pixel as said plurality of pixels, wherein each of said first layer type and said second layer type has an optical thickness of $\lambda_1/4$, said first spacer layer has four different optical thicknesses at said first pixel, said second pixel, said third pixel, and said fourth pixel, said first spacer layer at said first pixel has an optical thickness of between 0 and $\lambda_1/4$ inclusive, said first spacer layer at said second pixel has an optical thickness approximately equal to $\lambda_1/4$, said first spacer layer at said third pixel has an optical thickness of between $\lambda_1/4$ and $\lambda_1/2$ inclusive, and said first spacer layer at said fourth pixel has an optical thickness approximately equal to $\lambda_1/2$.

11. The solid-state imaging device according to claim 8, wherein, when a set wavelength which is set in relation to the light of the predetermined wavelength is $\lambda_2$, said near-infrared normalization filter includes:

a third layer type of a high refractive index material having an optical thickness of $\lambda_2/4$;

a fourth layer type of a low refractive index material having an optical thickness of $\lambda_2/4$ which is equal to the optical thickness of said third layer type;

two $\lambda_2/4$ multilayer films each of which includes layers of said third layer type and said fourth layer type; and a second spacer layer between said two $\lambda_2/4$ multilayer films and controls transmission of the light of the predetermined wavelength for each of said plurality of pixels.

12. The solid-state imaging device according to claim 8, wherein, when a set wavelength which is set in relation to the light of the predetermined wavelength is $\lambda_2$, said near-infrared normalization filter includes:

a third layer type of a high refractive index material having an optical thickness of $\lambda_2/4$;

a fourth layer type of a low refractive index material having an optical thickness of $\lambda_2/4$ which is equal to the optical thickness of said third layer type;

two $\lambda_2/4$ multilayer films each of which includes layers of said third layer type and said fourth layer type; and a second spacer layer between said two $\lambda_2/4$ multilayer films and controls transmission of the light of the predetermined wavelength for each of said plurality of pixels, wherein said second spacer layer has an optical thickness of $\lambda_2/2$.

13. The solid-state imaging device according to claim 11, wherein the set wavelength $\lambda_1$ is a wavelength of between 400 nm and 700 nm inclusive, and the set wavelength $\lambda_2$ is a wavelength of between 700 nm and 1100 nm inclusive.

14. The solid-state imaging device according to claim 1, wherein said visible-light and near-infrared filter and said near-infrared normalization filter comprise an identical material.

15. A camera comprising a solid-state imaging device according to claim 1.

16. The solid-state imaging device according to claim 1, wherein a wavelength band of light is substantially not transparent in each of the filters if the transmittance of light of the wavelength band through each of the filters is 20% or less, and wherein a wavelength band of light is substantially transparent in each of the filters if the transmittance of light of the wavelength band through each of the filters is 80% or more.

* * * * *